US007129121B2

(12) United States Patent
Azami et al.

(10) Patent No.: US 7,129,121 B2
(45) Date of Patent: Oct. 31, 2006

(54) METHOD FOR MANUFACTURING SEMICONDUCTOR DEVICE

(75) Inventors: Munehiro Azami, Atsugi (JP); Chiho Kokubo, Tochigi (JP); Aiko Shiga, Atsugi (JP); Atsuo Isobe, Atsugi (JP); Hiroshi Shibata, Higashine (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/159,278

(22) Filed: Jun. 23, 2005

(65) Prior Publication Data

US 2005/0245007 A1 Nov. 3, 2005

Related U.S. Application Data

(62) Division of application No. 10/330,019, filed on Dec. 27, 2002, now Pat. No. 6,911,358.

(30) Foreign Application Priority Data

Dec. 28, 2001 (JP) ............................. 2001-401281

(51) Int. Cl.
*H01L 21/00* (2006.01)
*H01L 21/84* (2006.01)
*H01L 21/336* (2006.01)
*H01L 21/8234* (2006.01)

(52) U.S. Cl. ...................... 438/150; 438/164; 438/197; 438/149

(58) Field of Classification Search ................ 438/150, 438/164, 166, 197, 153, 149
See application file for complete search history.

(56) References Cited

U.S. PATENT DOCUMENTS 4,177,372 A 12/1979 Kotera et al.

(Continued)

FOREIGN PATENT DOCUMENTS

EP 0 488 801 6/1992

(Continued)

OTHER PUBLICATIONS

R. Kakkad et al., *Low Temperature Selective Crystallization of Amorphous Silicon*, Journal of Non-Crystalline Solids, vol. 115, 1989, pp. 66-68.

(Continued)

*Primary Examiner*—Chuong Ann Luu
(74) *Attorney, Agent, or Firm*—Eric J. Robinson; Robinson Intellectual Property Law Office, P.C.

(57) ABSTRACT

A method for manufacturing a semiconductor device having steps of forming an amorphous semiconductor on a substrate having an insulating surface; patterning the amorphous semiconductor to form plural first island-like semiconductors; irradiating a linearly condensed laser beam on the plural first island-like semiconductors while relatively scanning the substrate, thus crystallizing the plural first island-like semiconductors; patterning the plural first island-like semiconductors that have been crystallized to form plural second island-like semiconductors; forming plural transistors using the plural second island-like semiconductors; and forming a unit circuit using a predetermined number of the transistors, where the second island-like semiconductors used for the predetermined number of the transistors are formed from the first island-like semiconductors that are different from each other.

9 Claims, 25 Drawing Sheets

U.S. PATENT DOCUMENTS

| | | |
|---|---|---|
| 4,316,074 A | 2/1982 | Daly |
| 4,330,363 A | 5/1982 | Biegesen et al. |
| 4,406,709 A | 9/1983 | Celler et al. |
| 4,592,799 A | 6/1986 | Hayafuji |
| 5,147,826 A | 9/1992 | Liu et al. |
| 5,246,870 A | 9/1993 | Merchant |
| 5,275,851 A | 1/1994 | Fonash et al. |
| 5,294,555 A | 3/1994 | Mano et al. |
| 5,306,584 A | 4/1994 | Palmer |
| 5,315,101 A | 5/1994 | Hughes et al. |
| 5,367,392 A | 11/1994 | Janai |
| 5,403,772 A | 4/1995 | Zhang et al. |
| 5,466,958 A | 11/1995 | Kakumu |
| 5,488,000 A | 1/1996 | Zhang et al. |
| 5,488,005 A | 1/1996 | Han et al. |
| 5,521,107 A | 5/1996 | Yamazaki et al. |
| 5,528,056 A | 6/1996 | Shimada et al. |
| 5,529,937 A * | 6/1996 | Zhang et al. ............... 438/471 |
| 5,543,636 A | 8/1996 | Yamazaki |
| 5,563,427 A | 10/1996 | Yudasaka et al. |
| 5,569,610 A | 10/1996 | Zhang et al. |
| 5,591,668 A | 1/1997 | Maegawa et al. |
| 5,592,318 A | 1/1997 | Majima et al. |
| 5,604,360 A | 2/1997 | Zhang et al. |
| 5,608,232 A | 3/1997 | Yamazaki et al. |
| 5,618,741 A | 4/1997 | Young et al. |
| 5,620,906 A | 4/1997 | Yamaguchi et al. |
| 5,625,473 A | 4/1997 | Kondo et al. |
| 5,656,825 A | 8/1997 | Kusumoto et al. |
| 5,679,588 A | 10/1997 | Choi et al. |
| 5,696,003 A | 12/1997 | Makita et al. |
| 5,698,882 A | 12/1997 | Park |
| 5,712,191 A | 1/1998 | Nakajima et al. |
| 5,736,751 A | 4/1998 | Mano et al. |
| 5,821,137 A | 10/1998 | Wakai et al. |
| 5,824,574 A | 10/1998 | Yamazaki et al. |
| 5,886,366 A | 3/1999 | Yamazaki et al. |
| 5,891,764 A | 4/1999 | Ishihara et al. |
| 5,937,282 A | 8/1999 | Nakajima et al. |
| 5,940,690 A | 8/1999 | Kusumoto et al. |
| 6,149,988 A | 11/2000 | Shinohara et al. |
| 6,169,292 B1 | 1/2001 | Yamazaki et al. |
| 6,204,099 B1 | 3/2001 | Kusumoto et al. |
| 6,221,701 B1 | 4/2001 | Yamazaki |
| 6,256,849 B1 | 7/2001 | Kim |
| 6,337,232 B1 * | 1/2002 | Kusumoto et al. .......... 438/151 |
| 6,410,368 B1 | 6/2002 | Kawasaki et al. |
| 6,455,401 B1 | 9/2002 | Zhang et al. |
| 6,555,875 B1 | 4/2003 | Kawasaki et al. |
| 6,570,184 B1 * | 5/2003 | Horikoshi et al. ............ 257/72 |
| 6,700,096 B1 | 3/2004 | Yamazaki et al. |
| 6,797,550 B1 | 9/2004 | Kokubo et al. |
| 2003/0047732 A1 | 3/2003 | Yamazaki et al. |
| 2003/0059990 A1 | 3/2003 | Yamazaki |
| 2003/0075733 A1 | 4/2003 | Yamazaki et al. |
| 2003/0080436 A1 * | 5/2003 | Ishikawa .................... 257/776 |
| 2003/0148594 A1 | 8/2003 | Yamazaki et al. |
| 2003/0153182 A1 | 8/2003 | Yamazaki et al. |
| 2003/0166315 A1 | 9/2003 | Tanada et al. |
| 2003/0171837 A1 | 9/2003 | Yamazaki et al. |
| 2003/0211714 A1 | 11/2003 | Yamazaki et al. |
| 2003/0228723 A1 | 12/2003 | Yamazaki et al. |
| 2003/0234395 A1 | 12/2003 | Kokubo et al. |
| 2004/0106237 A1 | 6/2004 | Yamazaki et al. |
| 2004/0132266 A1 | 7/2004 | Yamazaki et al. |

FOREIGN PATENT DOCUMENTS

| | | |
|---|---|---|
| JP | 59-165450 | 9/1984 |
| JP | 59-205761 | 11/1984 |
| JP | 60-245172 | 12/1985 |
| JP | 60-245173 | 12/1985 |
| JP | 60-245174 | 12/1985 |
| JP | 61-048976 | 3/1986 |
| JP | 61-071636 | 4/1986 |
| JP | 61-085868 | 5/1986 |
| JP | 61-251115 | 11/1986 |
| JP | 63-142807 | 6/1988 |
| JP | 01-134345 | 5/1989 |
| JP | 01-154124 | 6/1989 |
| JP | 01-194351 | 8/1989 |
| JP | 02-140915 | 5/1990 |
| JP | 04-170067 | 6/1992 |
| JP | 04-206970 | 7/1992 |
| JP | 04-282869 | 10/1992 |
| JP | 04-313272 | 11/1992 |
| JP | 05-067785 | 3/1993 |
| JP | 05-090589 | 4/1993 |
| JP | 05-206464 | 8/1993 |
| JP | 07-130652 | 5/1995 |
| JP | 08-078329 | 3/1996 |
| JP | 09-270393 | 10/1997 |
| JP | 10-135468 | 5/1998 |
| JP | 10-135469 | 5/1998 |
| JP | 11-354463 | 12/1999 |

OTHER PUBLICATIONS

Gang Liu et al., *Selective Area Crystallization of Amorphous Silicon Films by Low-Temperature Rapid Thermal Annealing*, Appl. Phys. Lett., vol. 55, No. 7, Aug. 14, 1989, p. 660-662.

Pole-Shang Lin et al., *The Impact of Scaling-Down Oxide Thickness on Poly-Si Thin-Film Transistors 'I-V Characteristics*, IEEE Electron Device Letters, vol. 15, No. 4, Apr. 1994, pp. 138-139.

To-Sing Li et al., *On the Pseudo-Subthreshold Characteristics of Polycrystalline-Silicon Thin-Film Transistors with Large Grain Size*, IEEE Electron Device Letters, vol. 14, No. 5, May 1993, pp. 240-242.

Jung-Yeal Lee et al., *High Performance Low Temperature Polysilicon Thin Film Transistor Using ECR Plasma Thermal Oxide as Gate Insulator*, IEEE Electron Device Letters, vol. 15, No. 8, Aug. 1994, pp. 301-303.

Jung-Yeal Lee et al., *ECR Plasma Oxidation Effects on Performance and Stability of Polysilicon Thin Film Transistors*, IEDM 1994, pp. 523-526.

A.V. Dvurechenskii et al., *Transport Phenomena in Amorphous Silicon Doped by Ion Implantation of 3d Metals*, Phys. Stat. Sol., vol. 95, 1986, pp. 635-640.

C. Hayzelden et al., *In Situ Transmission Electron Microscopy Studies of Silicide-Mediated Crystallization of Amorphous Silicon*, Appl. Phys. Lett., vol. 60, No. 2, Jan. 13, 1992, pp. 225-227.

T. Hempel et al., *Needle-Like Crystallization of Ni Doped Amorphous Silicon Thin Films*, Solid State Communications, vol. 85, No. 11, pp. 921-924, 1993.

R. Kakkad et al., *Crystallized Si Film by Low-Temperature Rapid Thermal Annealing of Amorphous Silicon*, J. Appl. Phys., vol. 65, No. 5, Mar. 11, 1989, pp. 2069-2072.

Gang Liu et al., *Polycrystalline Silicon Thin Film Transistors on Corning 7059 Glass Substrates Using Short Time, Low-Temperature Processing*, Appl. Phys. Lett., vol. 62, No. 20, May 17, 1993, pp. 2554-2556.

S. Caune et al., *Combined CW Laser and Furnace Annealing of Amorphous Si and Ge in Contact with Some Metals*, Applied Surface Science, vol. 36, 1989, pp. 597-604.

Akito Hara et al., *High Performance Poly-Si TFTs on a Glass by a Stable Scanning CW Laser Lateral Crystallization*, IEEE 2001, 4 Pages.

Fumiyo Takeuchi et al., *1-7.3: Performance of Poly-Si TFT Using the CW Laser Lateral Crystallization (CLC)*, IDMC 2002, pp. 73-76.

F. Takeuchi et al., *Performance of Poly-Si TFTs Fabricated by a Stable Scanning CW Laser Crystallization*, AM-LCD 2001, pp. 251-254.

Akito Hara et al., *High-Performance Polycrystalline Silicon Thin Film Transistors on Non-Alkali Glass Produced Using Continuous Wave Laser Lateral Crystallization*, Jpn. J. Appl. Phys., vol. 41, Mar. 15, 2002, pp. L311-L313.

Akito Hara et al., *Ultra-High Performance Poly-Si TFTs on a Glass by a Stable Scanning CW Laser Lateral Crystallization*, AM-LCD, 2001, pp. 227-230.

\* cited by examiner

FIG. 4
(A) Laser crystallization
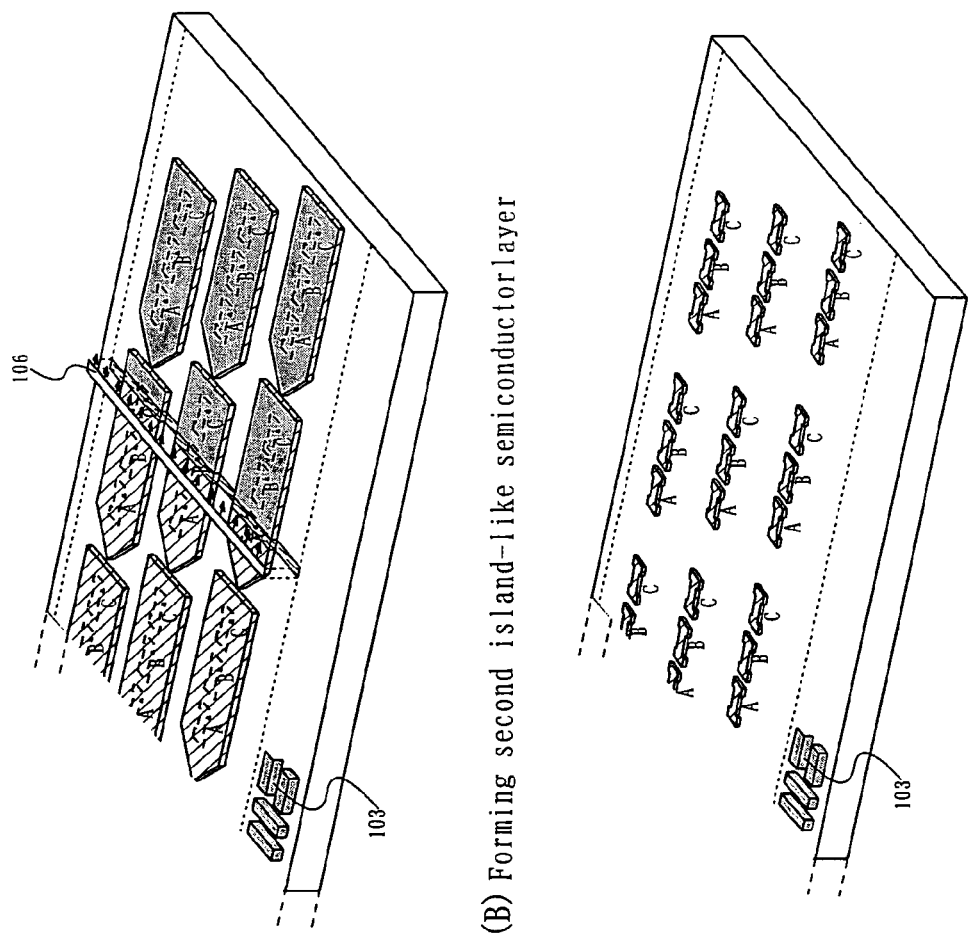
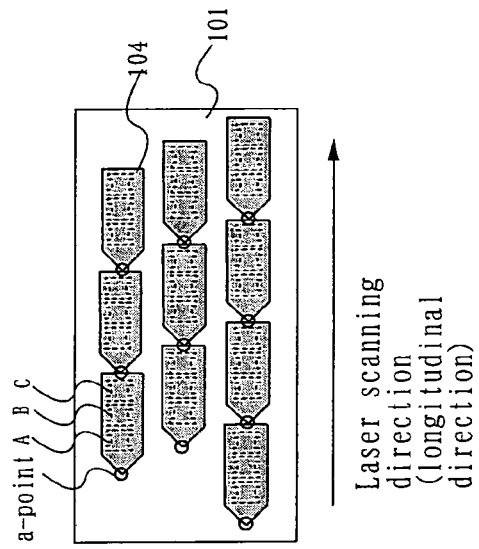
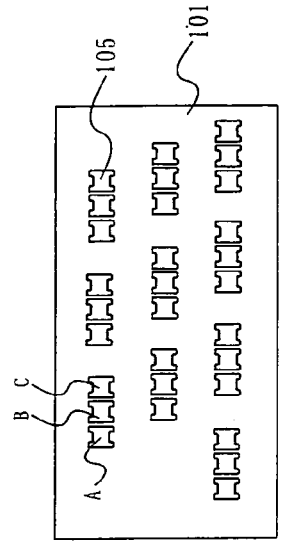
(B) Forming second island-like semiconductor layer 301 : a CW laser irradiation region
302 : a first island-like semiconductor layer
303 : a region to be a second island-like semiconductor lauer
304 : an end portion of a semiconductor layer
305 : a crystallized semiconductor layer
306 : a second island-like semiconductor layer
307 : a gate electrode
308, 309 : wirings

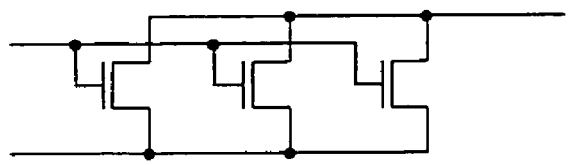
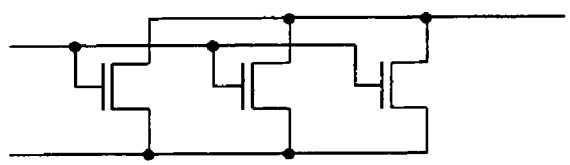
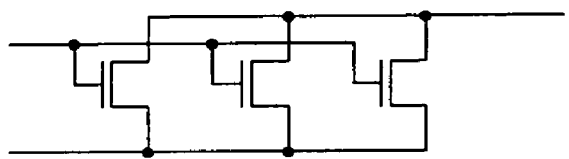
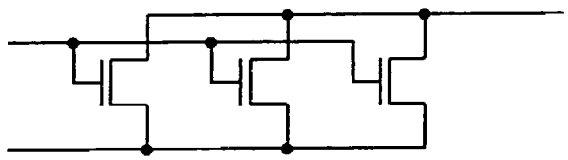
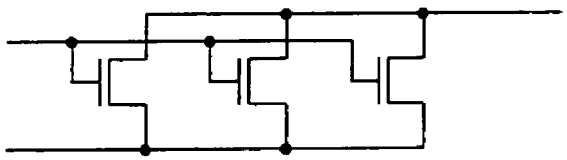
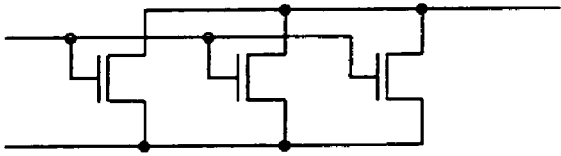
FIG. 9

FIG. 10
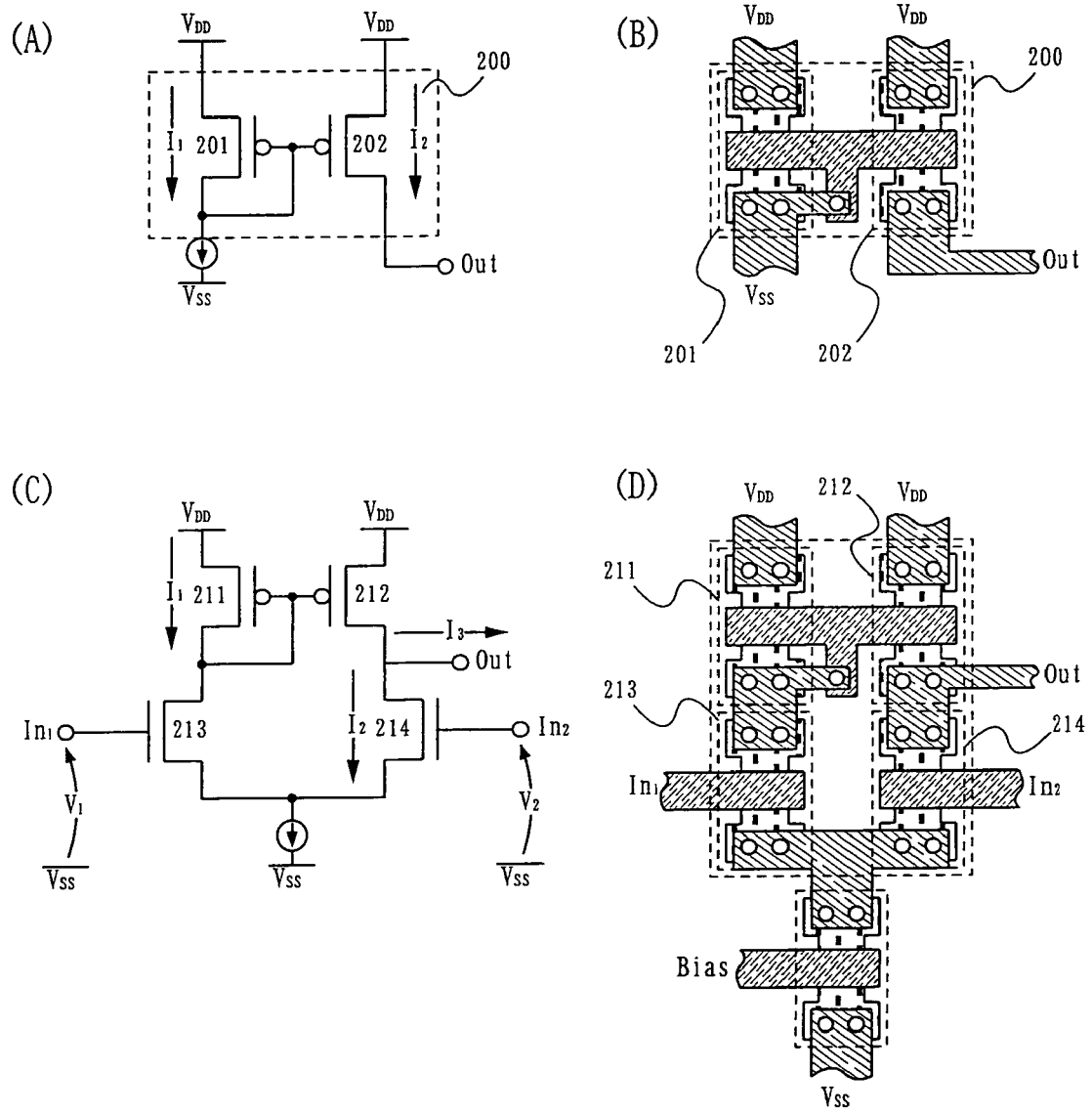
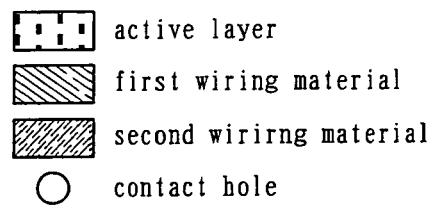

FIG. 11
(A)
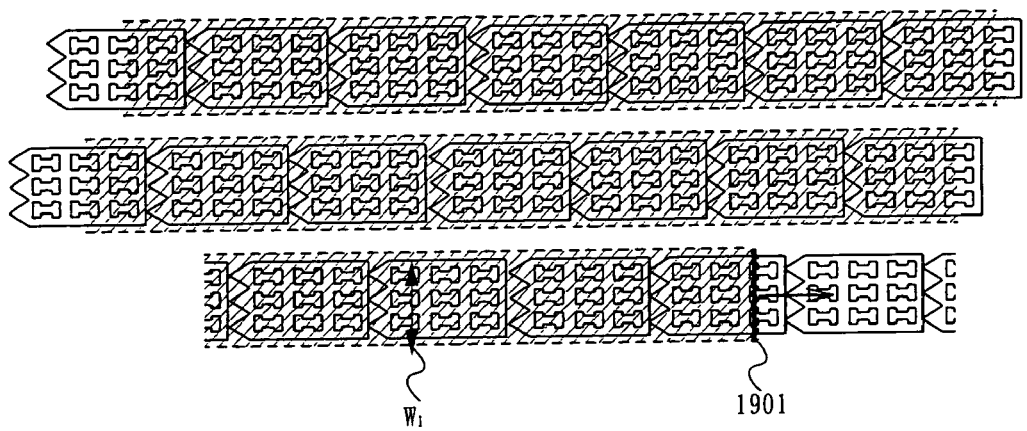
(B)
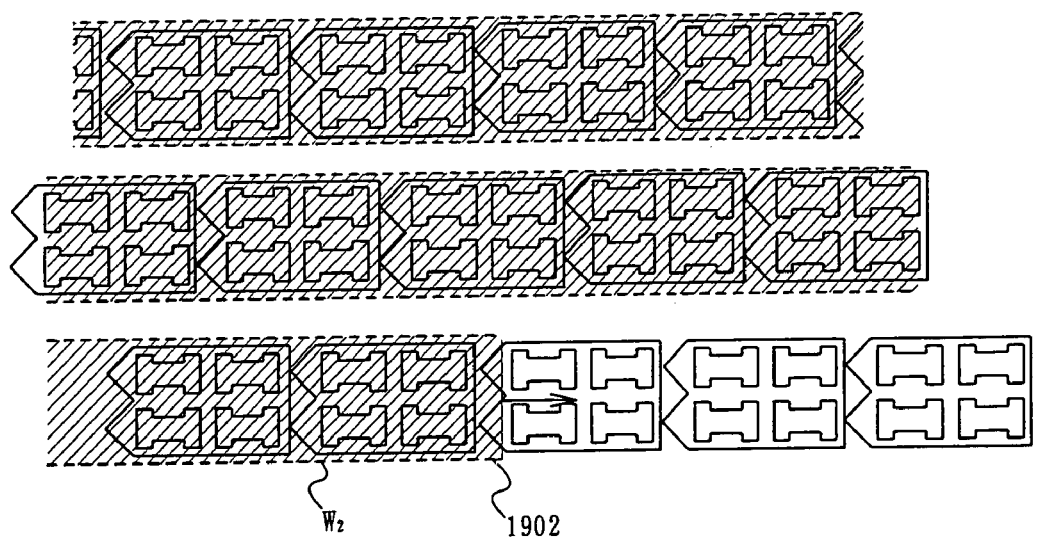

FIG. 12
(A)
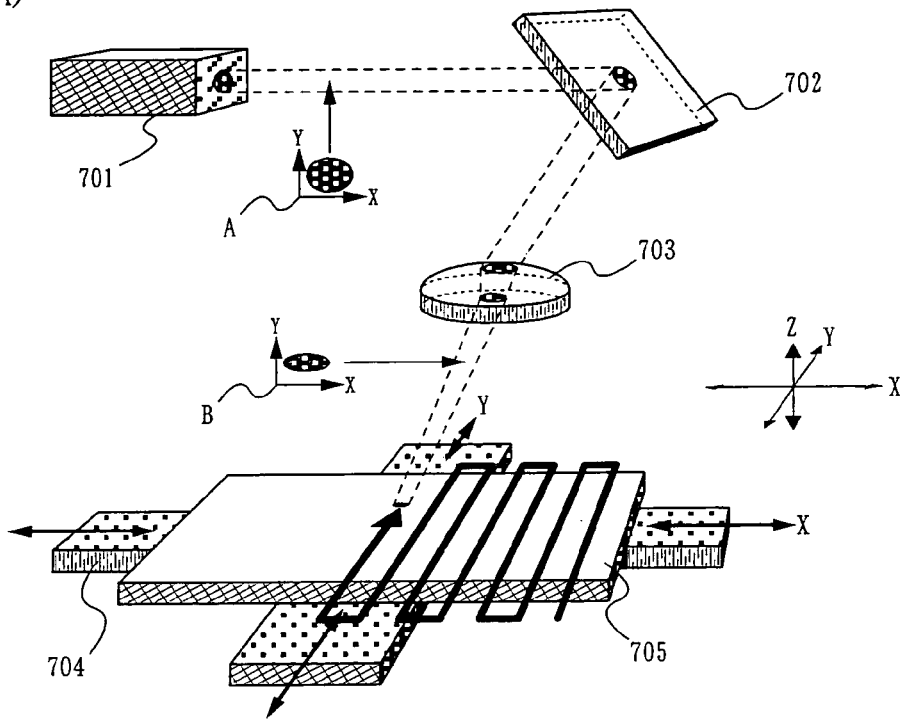
(B)
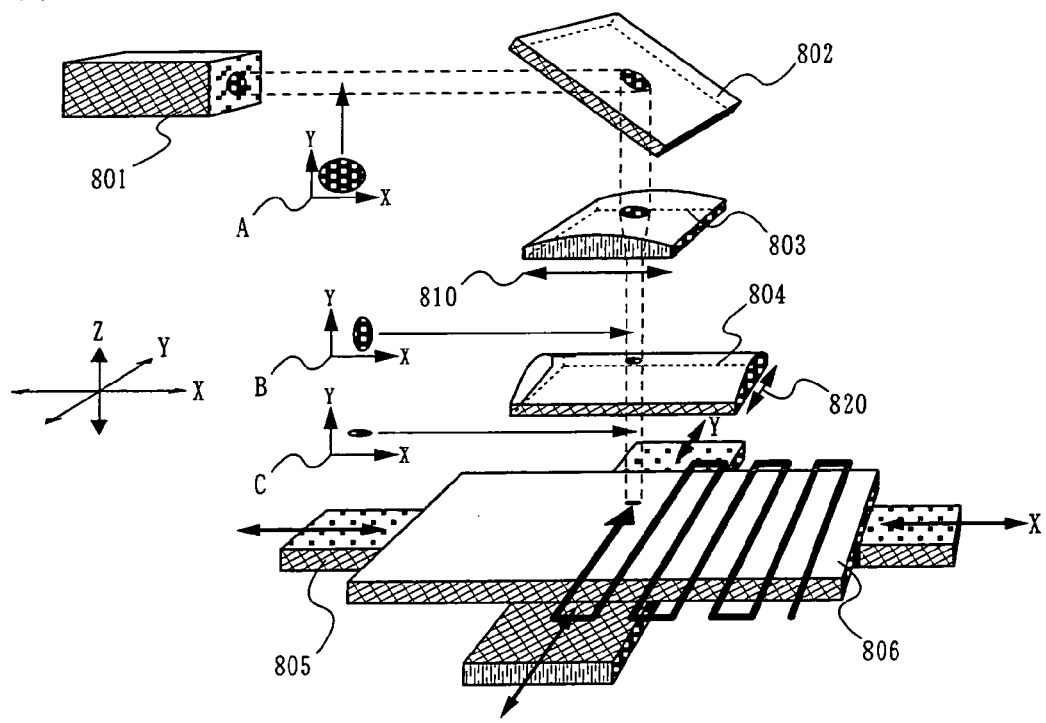

FIG. 14
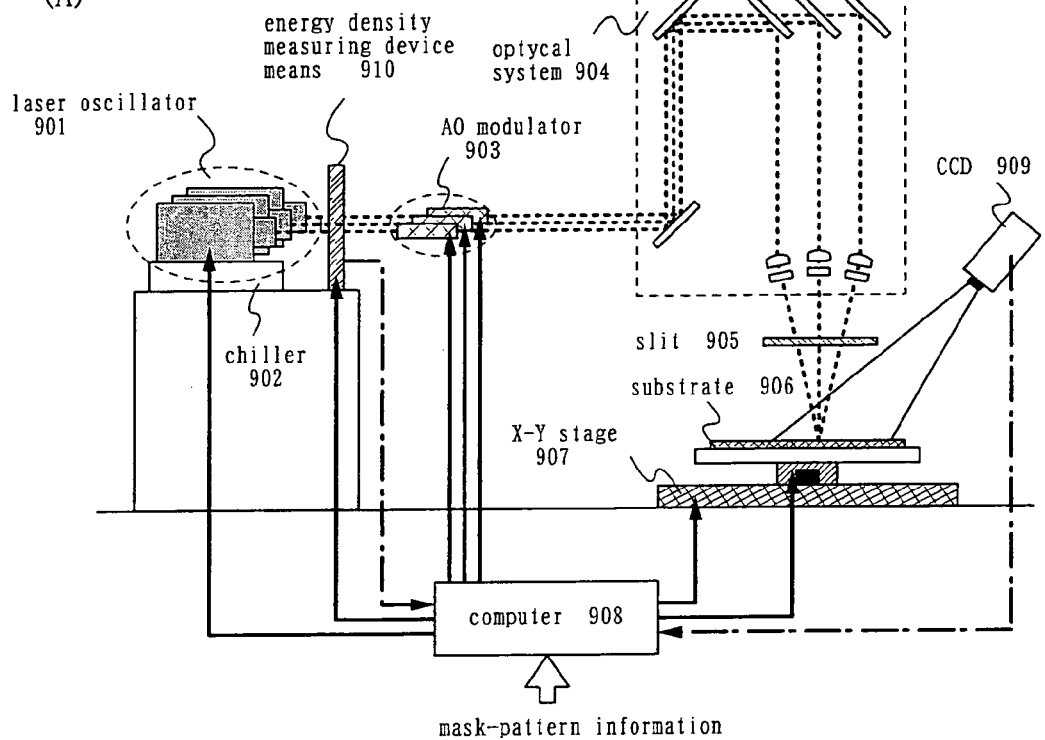
(A)
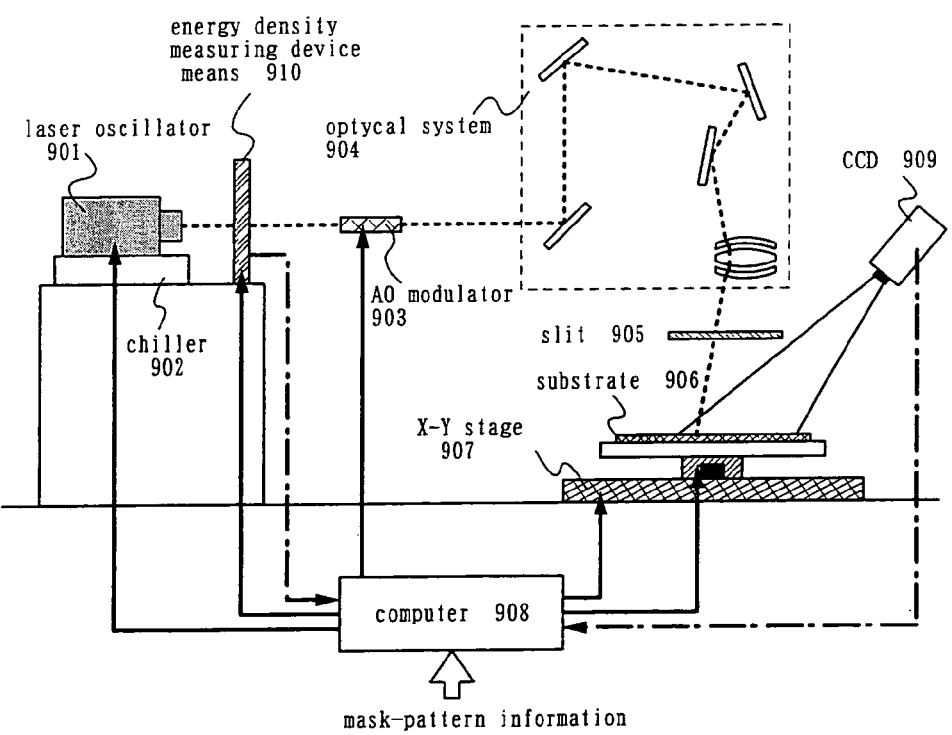
(B)
——— control signal output from computer 908
—·—·— detection signal input to computer 908

Fig. 17
(A) 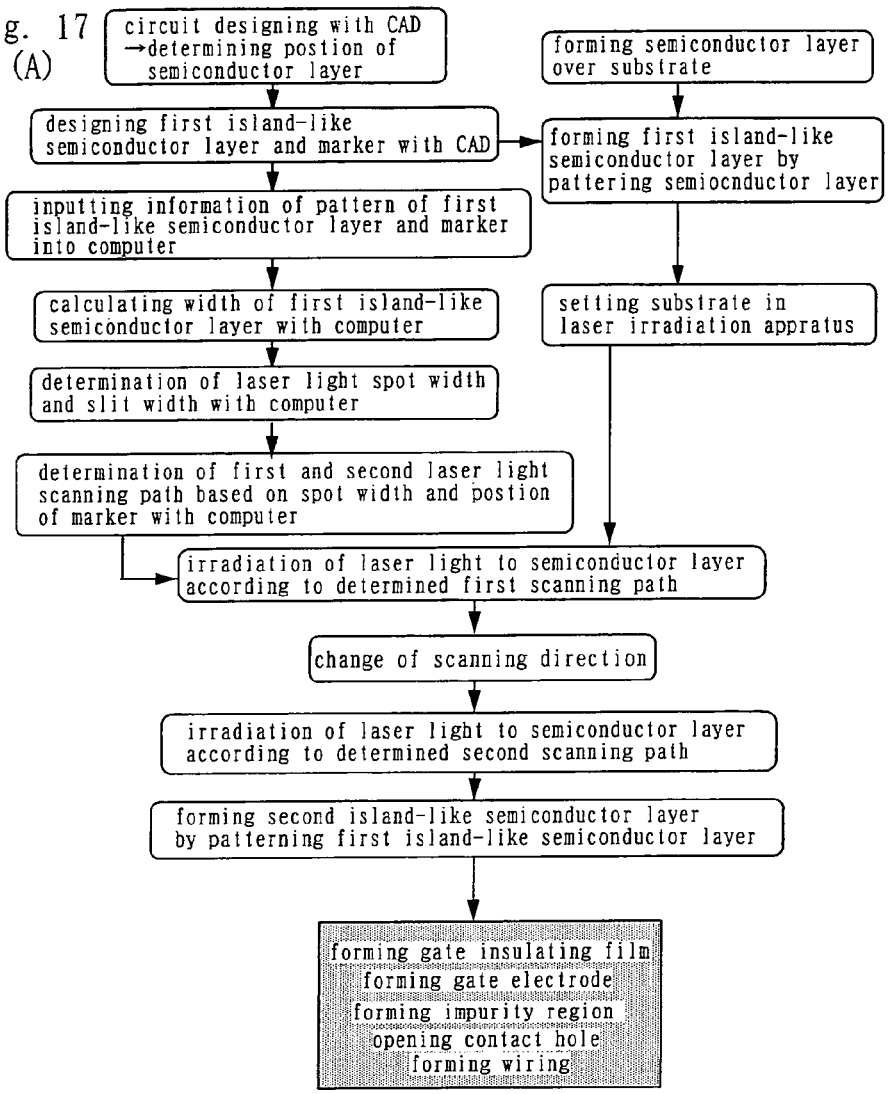
(B) 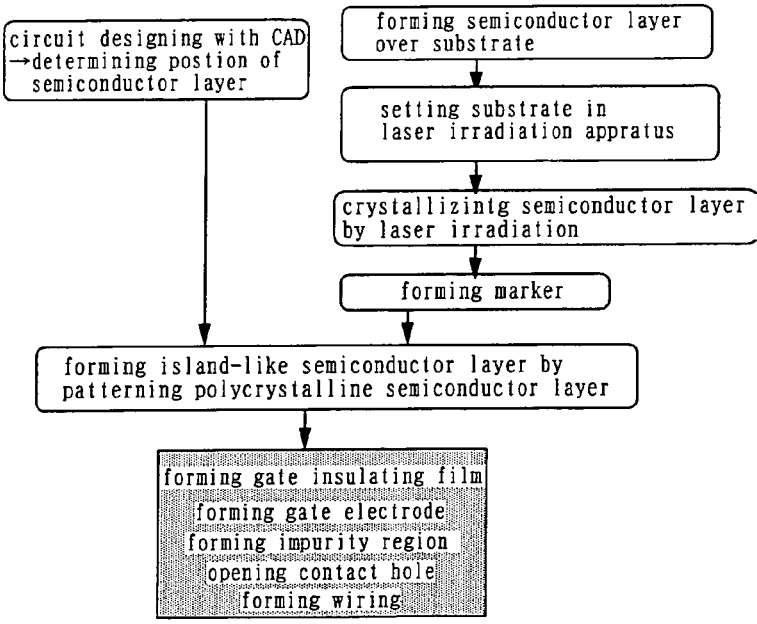

FIG. 18
(A)
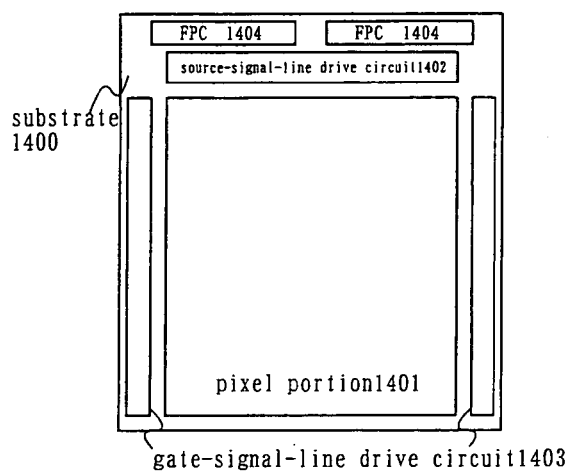
(B)
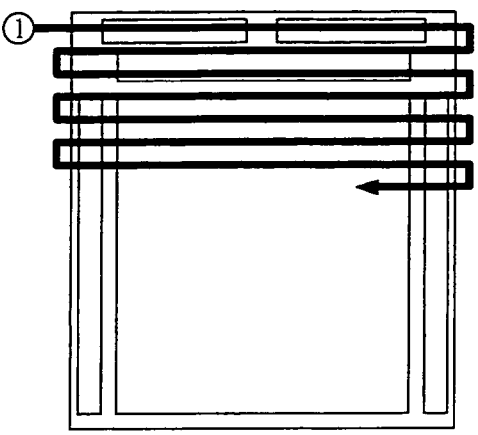
(C)
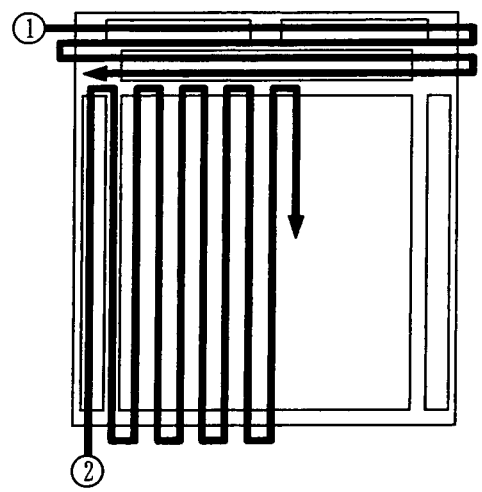
(D)
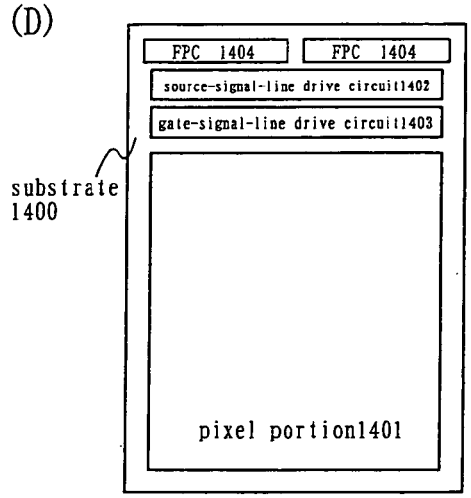
(E)
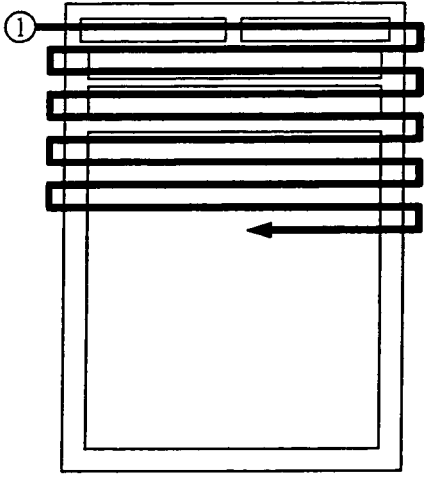

FIG. 19
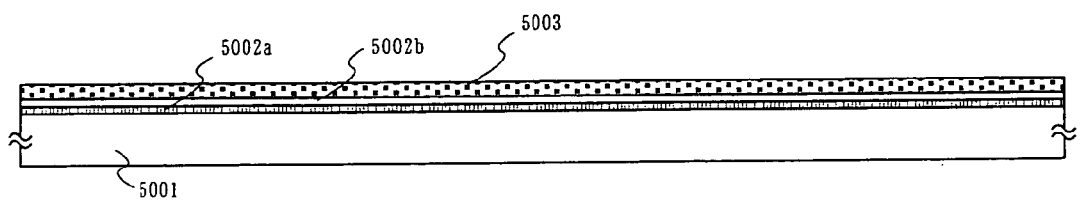
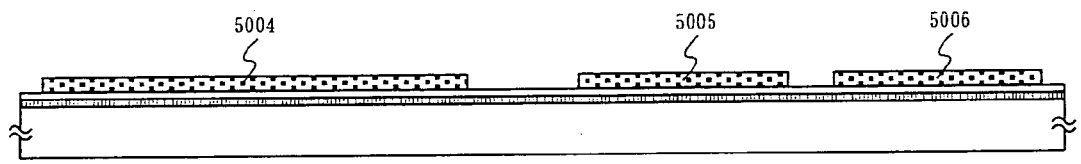
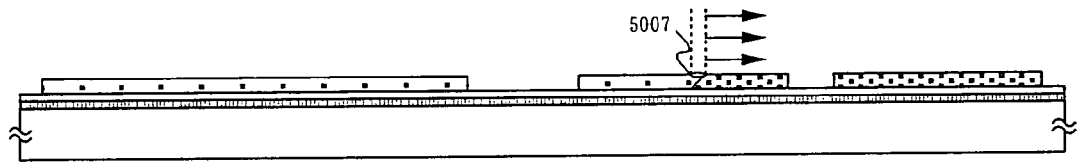
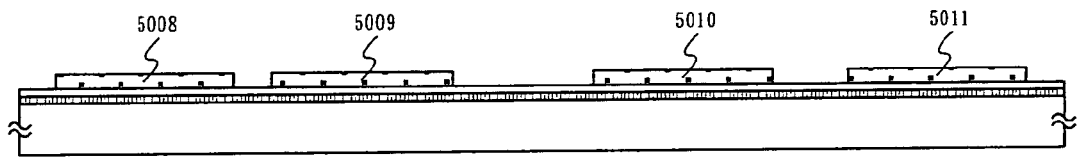
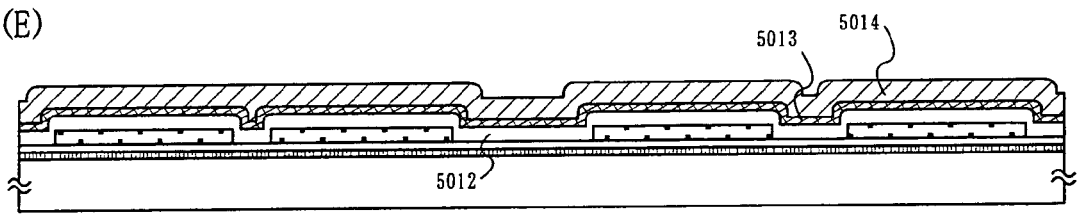
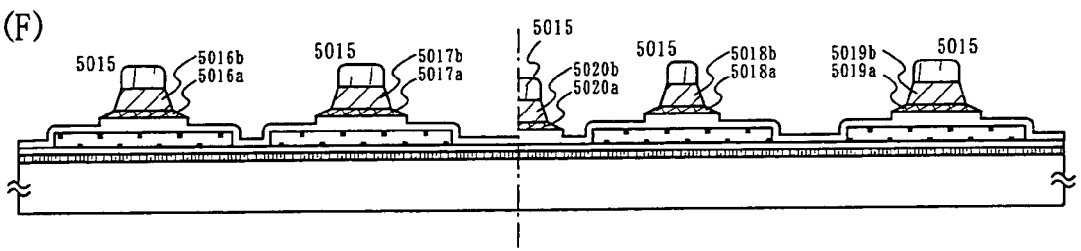

FIG. 20
(A)
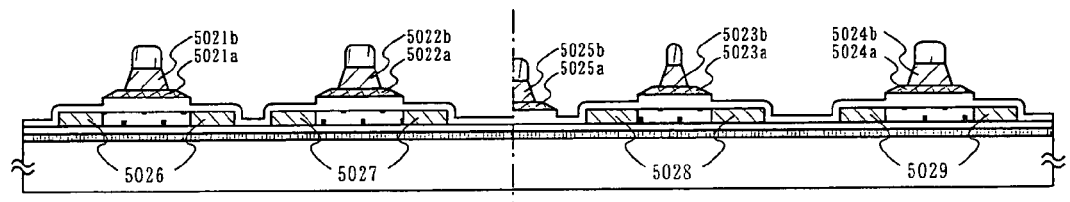
(B)
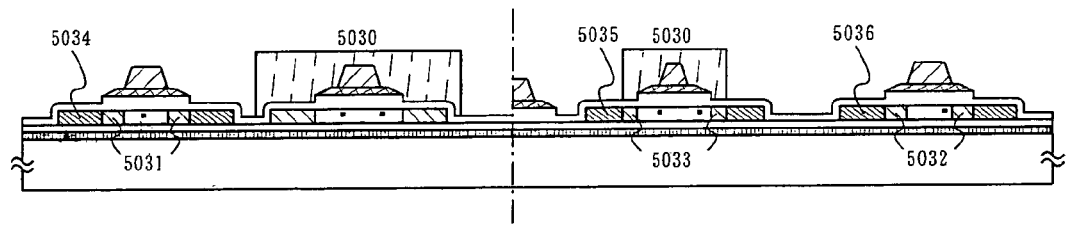
(C)
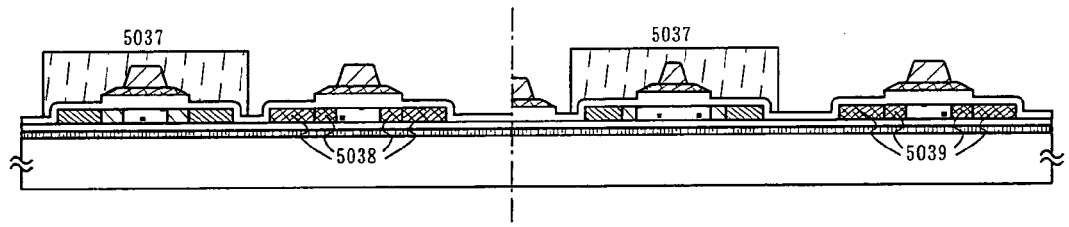
(D)
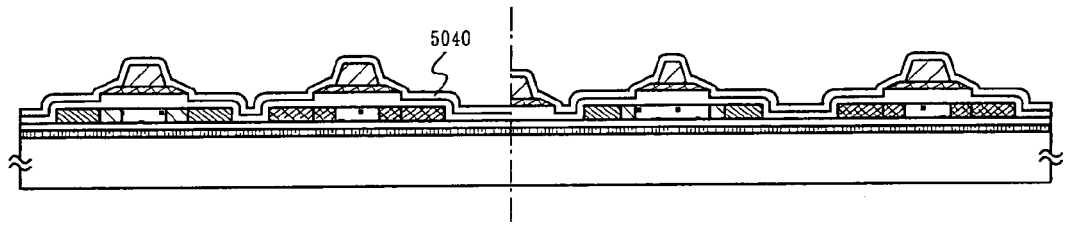
(E)
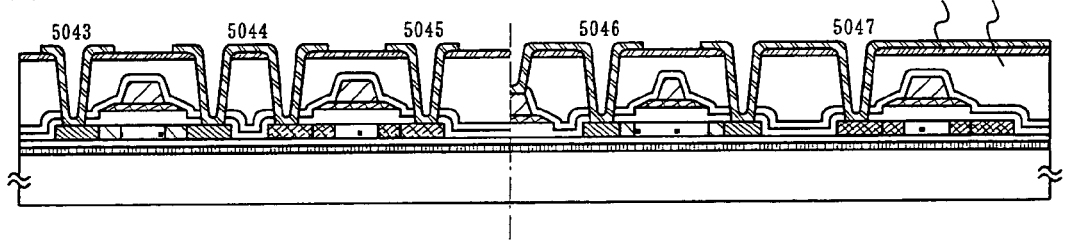

FIG. 21
formation of counter substrate/sealing liquid crystal
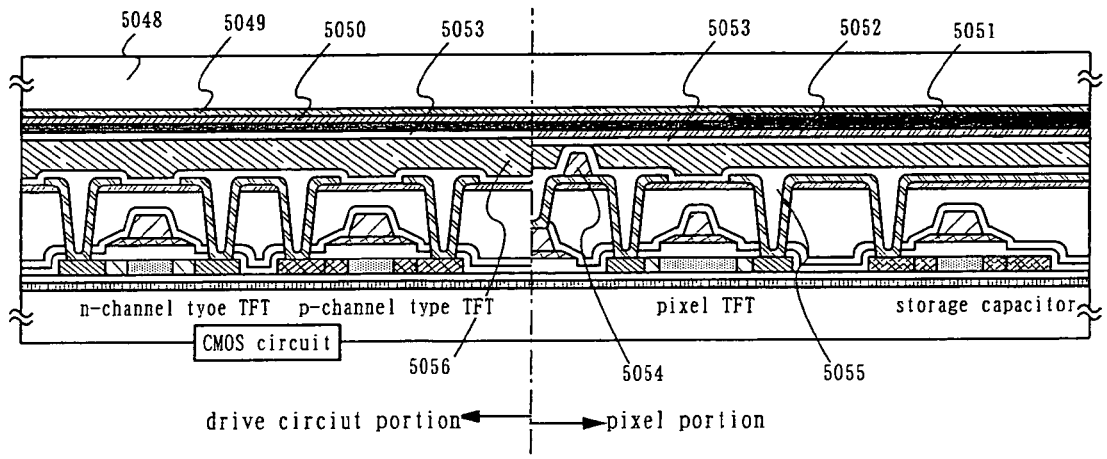
drive circuit portion ◄──┼──► pixel portion
FIG. 22
(A)
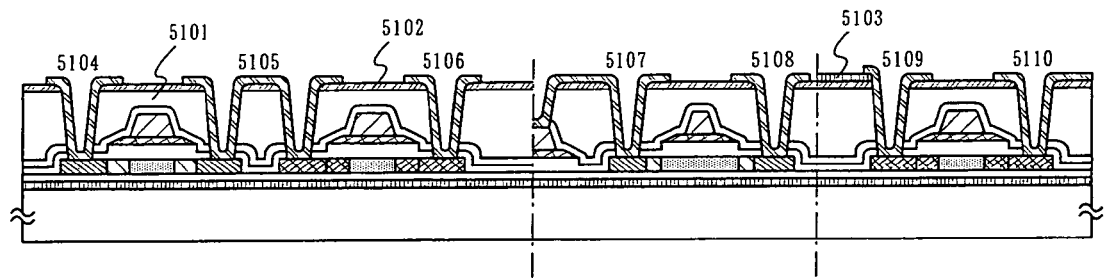
(B)
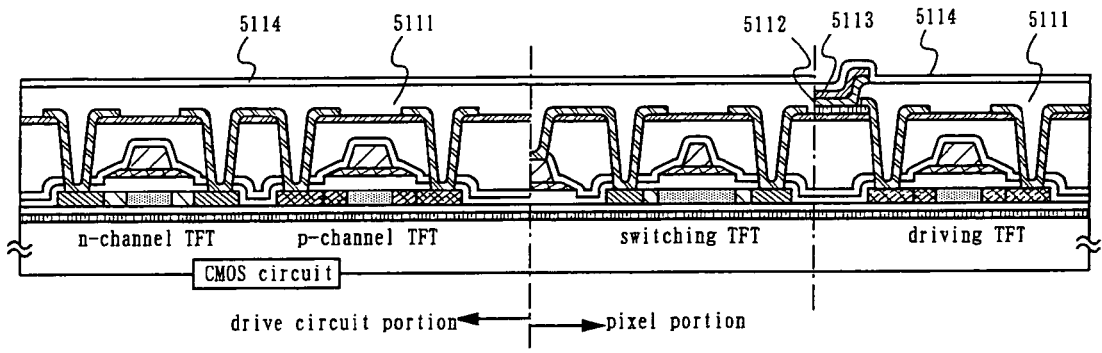
drive circuit portion ◄──┼──► pixel portion FIG. 23
(A)
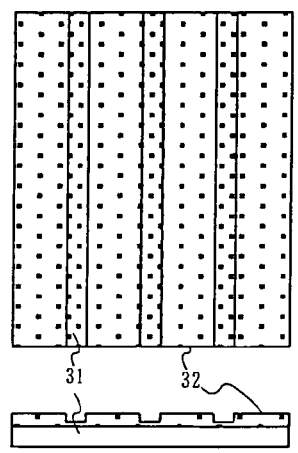
(B)
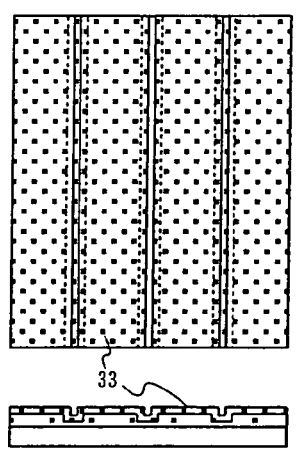
(C)
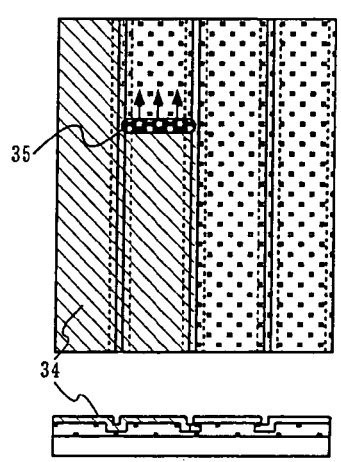

FIG. 24
(A)
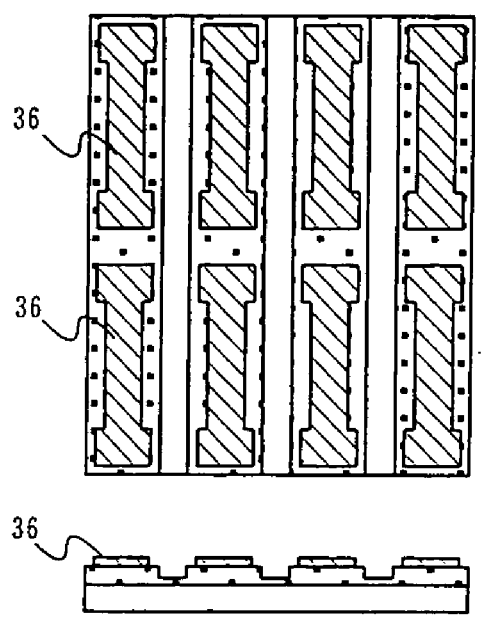
(B)
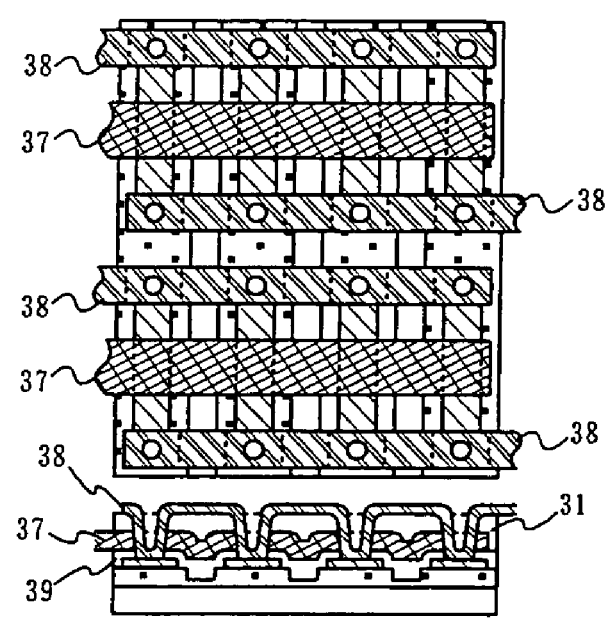

FIG. 26
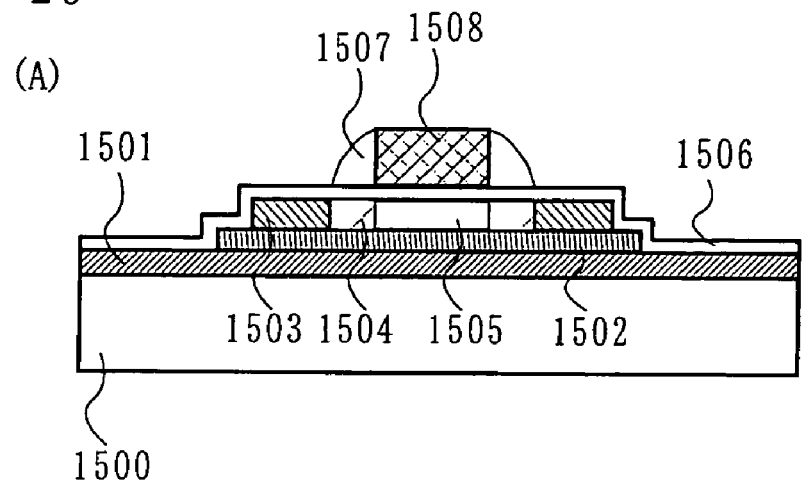
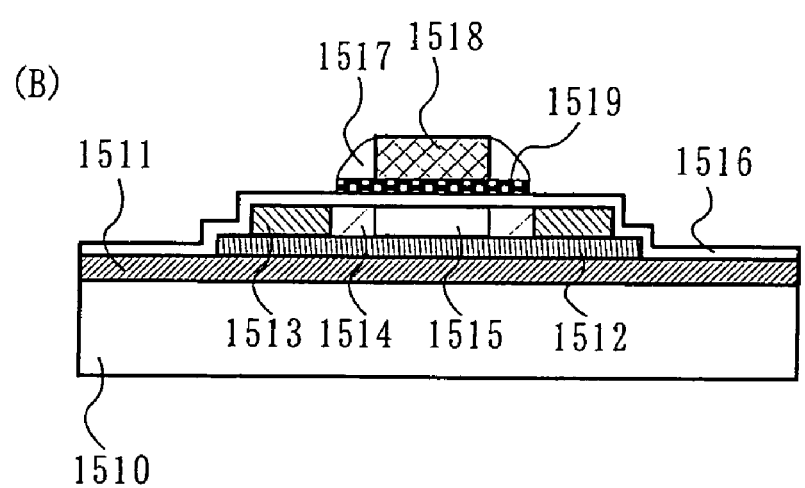
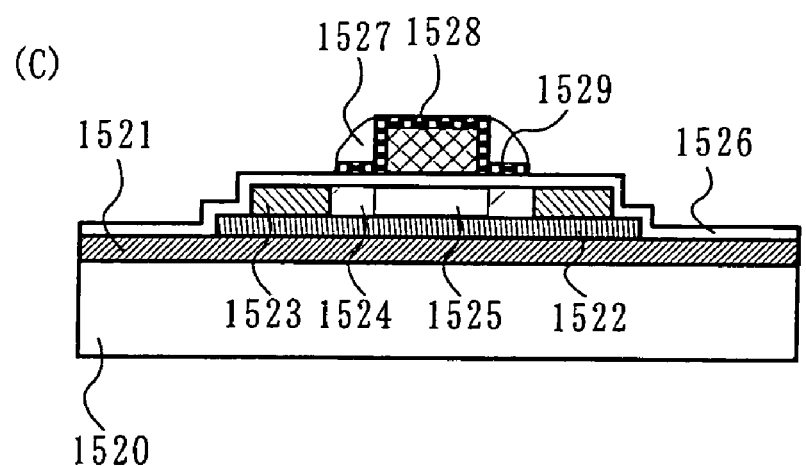

METHOD FOR MANUFACTURING SEMICONDUCTOR DEVICE

This invention relates to a semiconductor device and a method for preparing the same.

DESCRIPTION OF THE RELATED ART

Recently, a technique has been broadly used in which an amorphous semiconductor layer formed on an insulating material such as a glass substrate is crystallized to provide a crystalline semiconductor layer and a thin film transistor (hereinafter referred to as TFT) using the crystalline semiconductor layer as an active layer is formed. Its electrical property has been significantly improved.

As a result, a signal processing circuit, which was externally mounted using an IC or the like in the conventional technique, can be formed using a TFT, and a display device in which a pixel part and a driving circuit are integrally formed on a substrate is realized. Since the small size and light weight of the display device because of reduction in number of components enable significant reduction in manufacturing cost, a broad range of research and development on the display device has been recently carried out.

BRIEF SUMMARY OF THE INVENTION

There are cases in which electrical properties are different even if TFTs having the same size are fabricated when TFTs are fabricated using polysilicon.

Typical circuits formed using transistors are operational amplifiers and differential amplifiers. FIG. 10A shows a current mirror circuit. FIG. 10B shows an exemplary layout of the current mirror circuit on an actual substrate. FIG. 10C shows a differential amplifier. FIG. 10D shows an exemplary layout of the differential amplifier on an actual substrate.

As shown in FIG. 10A, the current mirror circuit has two transistors. A drain current $I_1$ flowing through a transistor 201 and a drain current $I_2$ flowing through a transistor 202 need be equal. That is, the current mirror circuit operates on the assumption that the transistor 201 and the transistor 202 have the same property. As a result, if the electrical properties of the two transistors are not equal, $I_1=I_2$ cannot necessarily be achieved and therefore the current mirror circuit does not function as a circuit. Therefore, in most cases, transistors constituting a current mirror circuit have equal channel length, channel width and the like.

Next, as shown in FIG. 10C, the differential amplifier has a current mirror circuit as an active load. This differential amplifier is a circuit such that a waveform formed by amplifying the potential difference between signals inputted to $In_1$ and $In_2$ can be taken out from an output terminal (Out), utilizing $I_1=I_2+I_3$ realized by the current mirror circuit when different electric potentials are supplied to input terminals ($In_1$, $In_2$). This circuit, too, operates on the assumption that TFTs 221 to 214 have the same electric property.

In short, in the current mirror circuit shown in FIGS. 10A and 10B and the differential amplifier shown in FIGS. 10C and 10D, the plural constituent TFTs must have device consistency. Actually, however, a p-SiTFT is formed by concentrating many crystal grains in a semiconductor layer and its electrical property is degraded because the crystal grains have different orientations on the grain boundaries though each of the crystal grains has a good crystal state. That is, a p-Si TFT has many such crystal grains contained in the active layer, and the difference in number of crystal grains and the difference in orientation between adjacent crystal grains may cause difference in electric property. Even if TFTs of the same size are manufactured and the same voltage is applied to their electrodes, the current values may differ.

In view of the foregoing status of the art, it is an object of the present invention to provide a method for manufacturing a semiconductor device which restrains the influence of difference in electric property between circuits requiring consistency of plural TFTs as in the above-described current mirror circuit.

BRIEF DESCRIPTION OF THE SEVERAL VIEWS OF THE DRAWINGS

FIGS. 4A–4B are views for explaining an embodiment mode of the present invention.

FIG. 9 is a view for explaining an embodiment mode of the present invention.

FIGS. 10A–10D are views showing a current mirror circuit and a differential amplifier.

FIGS. 11A–11B are views for explaining laser irradiation on a semiconductor layer.

FIGS. 12A–12B are views for explaining a laser irradiation device.

FIGS. 14A–14B are views for explaining a laser irradiation device.

FIGS. 17A–17B are views for explaining process flows including crystallization by laser irradiation on a semiconductor layer.

FIGS. 18A–18E are views for explaining a process for preparing a semiconductor device.

FIGS. 19A–19F are views for explaining a process for preparing a semiconductor device.

FIGS. 20A–20E are views for explaining a process for preparing a semiconductor device.

FIG. 21 is a view for explaining a process for preparing a semiconductor device.

FIGS. 22A–22B are views for explaining a process for preparing a semiconductor device.

FIGS. 23A–23C are views for explaining a process for preparing a semiconductor device.

FIGS. 24A–24B are views for explaining a process for preparing a semiconductor device.

FIGS. 26A–26C are views for explaining a process for preparing a semiconductor device.

DETAILED DESCRIPTION OF THE INVENTION

In view of the foregoing object, the present invention provides the following measures.

A method for manufacturing a semiconductor device according to the present invention comprises:

forming an amorphous semiconductor on a substrate having an insulating surface;

patterning said amorphous semiconductor into a desired shape to form plural first island-like semiconductors;

irradiating a linearly condensed laser beam on the plural first island-like semiconductors while relatively scanning the substrate, thus crystallizing the plural first island-like semiconductors;

patterning the plural first island-like semiconductors that have been crystallized into a desired shape to form plural second island-like semiconductors;

forming plural transistors using the plural second island-like semiconductors; and forming a unit circuit using a predetermined number of the transistors, of the plural transistors;

wherein the second island-like semiconductors used for the predetermined number of the transistors are formed from the first island-like semiconductors that are different from each other.

Another method for producing a semiconductor device according to the present invention comprises:

forming an amorphous semiconductor on a substrate having an insulating surface;

forming a metal-containing layer on the amorphous semiconductor and forming a first crystalline semiconductor by heat treatment;

patterning the first crystalline semiconductor into a desired shape to form plural first island-like semiconductors;

irradiating a linearly condensed laser beam on the plural first island-like semiconductors while relatively scanning the substrate, thus forming the plural first island-like semiconductors containing second crystalline semiconductors;

patterning the first island-like semiconductors containing the second crystalline semiconductors into a desired shape to form plural second island-like semiconductors;

forming plural transistors using the plural second island-like semiconductors; and forming a unit circuit using a predetermined number of the transistors, of the plural transistors;

wherein the second island-like semiconductors used for the predetermined number of the transistors are formed from the first island-like semiconductors that are different from each other.

With the above-described structure, the present invention can equalize the properties of unit circuits and therefore can restrain the influence of difference in property of TFTs.

EMBODIMENT MODES OF THE INVENTION

Embodiment Mode 1

Figure 3:
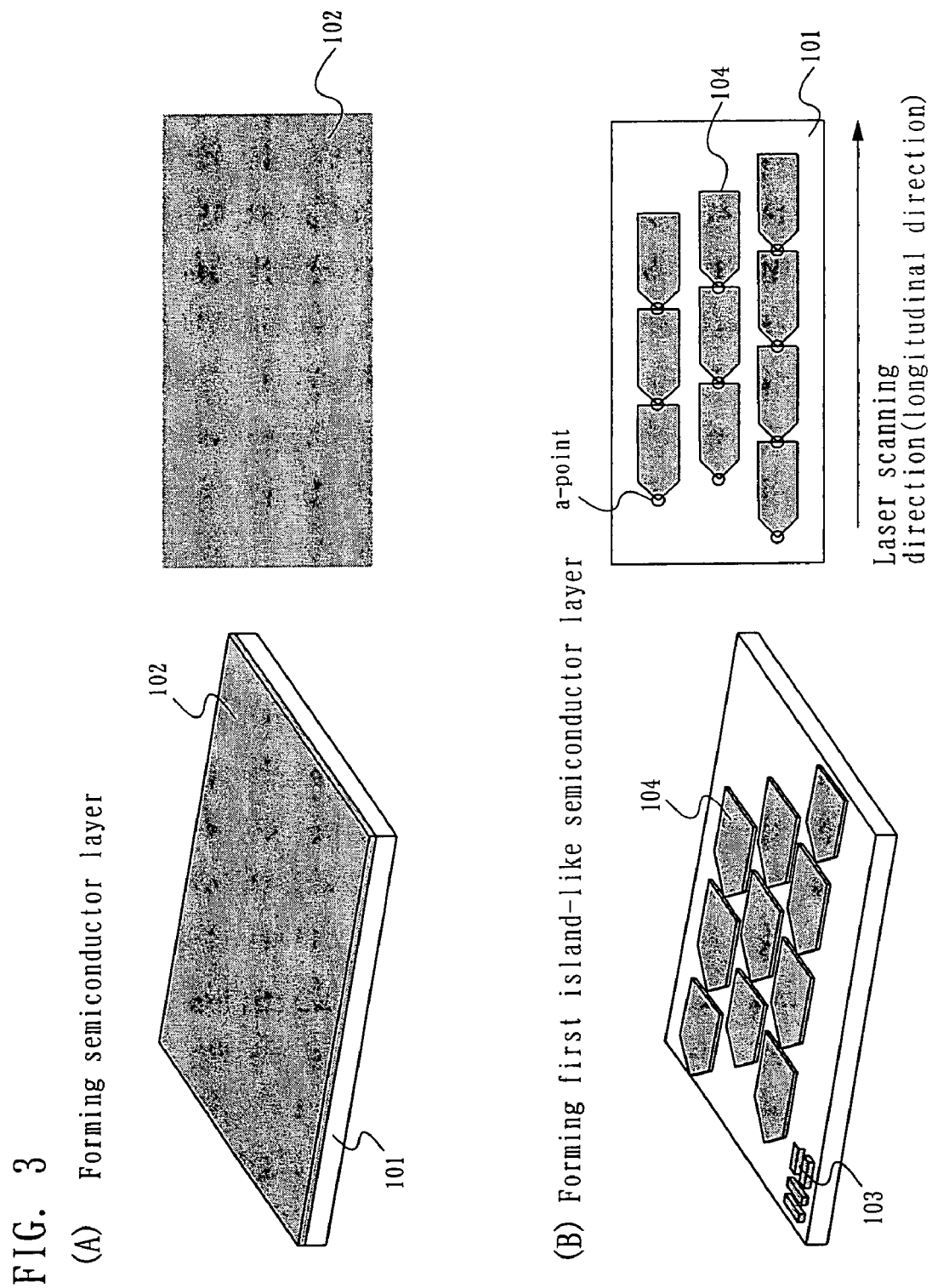
FIGS. 3A–3B are views for explaining an embodiment mode of the present invention.
Figure 5:
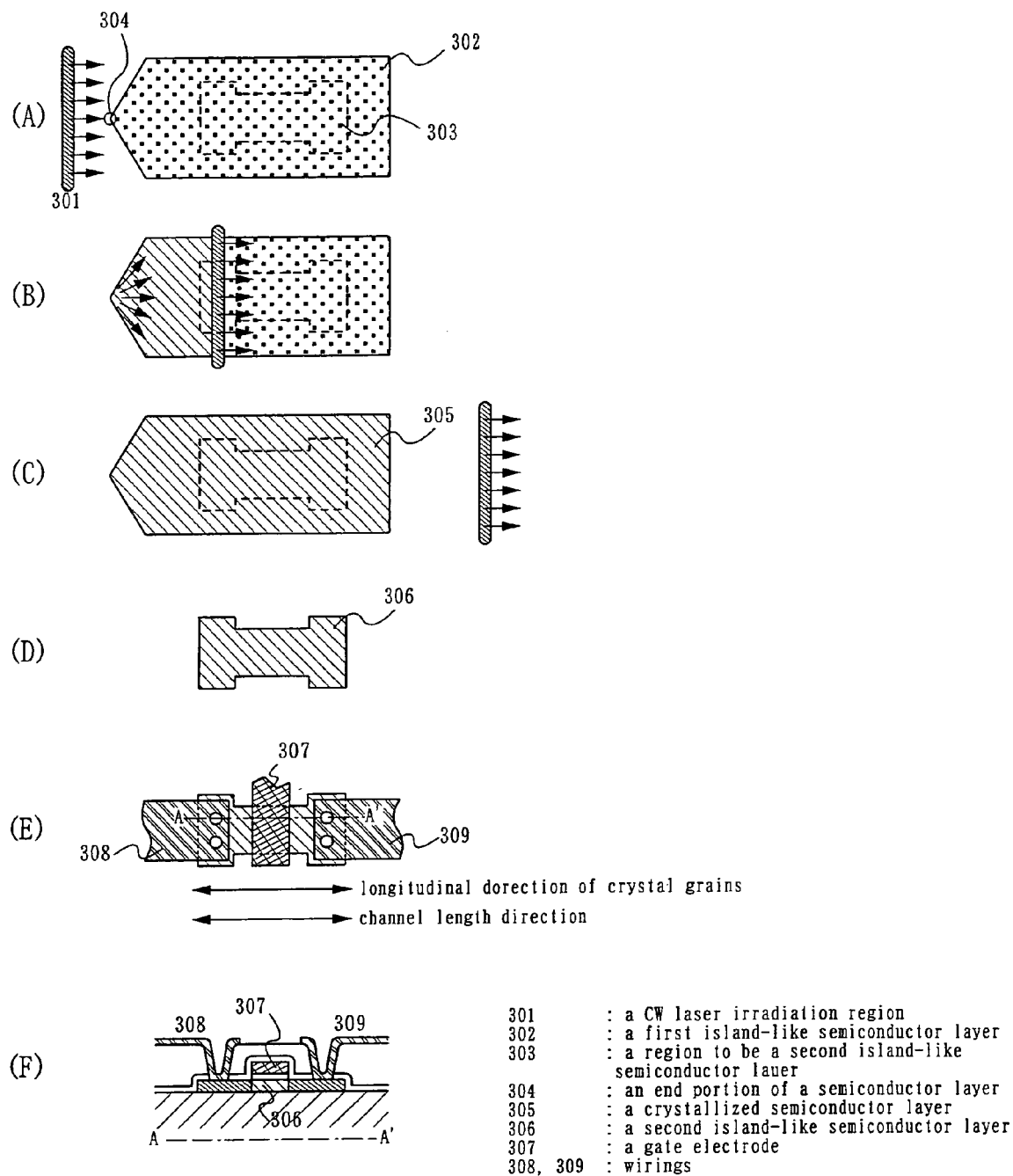
FIGS. 5A–5F are views for explaining an embodiment mode of the present invention.

An embodiment mode of the present invention will now be described with reference to FIGS. 3 to 5. FIGS. 3 to 5 show a method for preparing a semiconductor device according to the present invention. In FIGS. 3A and 3B and FIGS. 4A and 4B, oblique views are shown on the left side and top views are shown on the right side. FIGS. 5A to 5F simply show the method for preparing a semiconductor device according to the present invention.

A semiconductor 102 is formed on a substrate 101 (FIG. 3A). As the substrate 101, any material that is durable to the processing temperature throughout the manufacture of a semiconductor device may be used. For example, a quartz substrate, a silicon substrate, a non-alkaline glass substrate containing barium borosilicate glass or aluminoborosilicate glass or the like, or a substrate having an insulating film formed on a surface of a metal substrate can be used. Also a plastic substrate that is heat-resistant enough to be durable to the processing temperature may be used.

Between the substrate 101 and the semiconductor 102, an base film for preventing contamination of the semiconductor 102 due to impurity such as alkaline metal contained in the substrate 101 may be formed using an insulating film or the like. The semiconductor 102 may be deposited using a known technique (sputtering, LPCVD, or plasma CVD). The semiconductor 102 may be an amorphous semiconductor or may be a microcrystalline or polycrystalline semiconductor.

Next, the semiconductor 102 is patterned to form an alignment marker 103 and first island-like semiconductors 104 (FIG. 3B). In the present invention, plural first island-like semiconductors 104 are arranged in parallel on the substrate 101. The first island-like semiconductor 104 has one or plural sharp pointed end parts. A laser beam is caused to scan from the one or plural pointed end parts to the other end part on the opposite side. That is, in the first island-like semiconductor 104, a laser beam first reaches the pointed end part. In this embodiment mode, the pointed end part is referred to as a-point. In the present invention, the plural first island-like semiconductors are arranged in parallel in the longitudinal direction. In the lateral direction, the plural first island-like semiconductors are slightly shifted from each other so that the pointed end parts (a-points) of the first island-like semiconductors are not aligned with each other (FIG. 3B). The alignment marker 103 and the first island-like semiconductors 104 are not limited to the shapes shown in FIG. 3B.

Next, as shown in FIG. 4A, a laser irradiating position is decided on the basis of the alignment marker 103 and a laser beam 106 is irradiated on the first island-like semiconductors 104, thereby crystallizing the first island-like semiconductors 104. In the case where the semiconductors forming the first island-like semiconductors have been crystallized to a certain extent, the crystallinity is further increased by this laser irradiating step. In this case, a slit (not shown) covers an area having a low energy density of the laser beam, thus preventing irradiation of the semiconductors with the laser beam in this area. If a laser beam with a low energy density is irradiated on and crystallizes the semiconductor, the resulting crystal grains are microcrystal grains of approximately 0.1 μm or less and such a crystalline semiconductor cannot provide an excellent electrical property. Whether the energy density is enough or not is judged on the basis of whether desired crystal grains can be obtained or not in the semiconductor. A designer may properly judge this. Therefore, if the designer judges that the crystallinity is not enough, it is judged that the energy density is low.

Since the energy density of the laser beam is lowered near an end part of a laser beam spot obtained through the slit, crystal grains become smaller near an end part of irradiating and a protruding part (ridge) appears along the crystal grain boundary. Therefore, the trajectory of the laser beam spot (indicated by dotted lines in FIG. 4A) and the first island-like semiconductors 104 are arranged so as not to overlap each other. At least, areas of second island-like semiconductors (indicated by dotted lines in the first island-like semiconductors 104 in FIG. 4A), which will be formed later from the first island-like semiconductors 104, are arranged so as not to overlap the trajectory of the laser beam spot.

When irradiating the laser beam on the first island-like semiconductors, the scanning direction of the laser beam or the shape of the first island-like semiconductors is decided so that when the laser beam spot reaches the end part of the first island-like semiconductor, the laser beam spot and the first island-like semiconductor contact each other at one point, as viewed from the front or back side of the substrate. In FIG. 4A, each of the first island-like semiconductors 104 first contacts the laser beam spot at its pointed end part (a-point). As irradiation with the laser beam is started at one contact point in this manner and the semiconductor is thus crystallized, a crystal having a (100) orientational plane grows from the vicinity of the contact point including this contact point. Therefore, finally, the rate of the (100) orientational plane is increased in the first island-like semiconductors. That is, since the crystal grains have uniform orientational planes, electrons or holes smoothly migrate near the grain boundary. Such crystalline semiconductors have very high field-effect mobility.

In the present invention, plural second island-like semiconductors are formed from the first island-like semiconductors 104. In this specification, for example, it is assumed that three second island-like semiconductors 105 are formed from each of the first island-like semiconductors 104 shown in FIGS. 3 and 4. The three second island-like semiconductors 105 are referred to, from the side of the pointed end part (a-point), as second island-like semiconductor A, second island-like semiconductor B, and second island-like semiconductor C. Then, since crystallization starts at the pointed end part (a-point) of the first island-like semiconductor 104, the crystallinity of the second island-like semiconductors A to C differs. In other words, the electric properties of the second island-like semiconductors depend on the distance from the pointed end part (a-point). Thus, in the present invention, the following measure is taken to restrain the difference in property of the circuit constituted by the second island-like semiconductors A to C.

In the present invention, the plural first island-like semiconductors are arranged in parallel in the longitudinal direction. In the lateral direction, the first island-like semiconductors are slightly shifted from each other so that the a-points of the first island-like semiconductors are not aligned with each other. In the present invention, a unit circuit is formed using three different second island-like semiconductors formed from three different first island-like semiconductors. In this case, of the three first island-like semiconductors, a part corresponding to the second island-like semiconductor A from one first island-like semiconductor, a part corresponding to the second island-like semiconductor B from another first island-like semiconductor, and a part corresponding to the second island-like semiconductor C from the other first island-like semiconductor are arranged to be aligned with each other in the lateral direction.

In this specification, a unit circuit means a circuit in which plural transistors are electrically connected with each other. Typically, it is a circuit in which plural transistors are connected in parallel and are electrically connected with each other. For example, an analog switch, a current source, a current mirror circuit, a differential amplifier, an operational amplifier circuit and the like are equivalent to unit circuits.

Next, as shown in FIG. 4B, the crystallized first island-like semiconductors 104 are patterned to form the second island-like semiconductors 105 of a desired shape. It is desired that the second island-like semiconductors 105 use areas near the center of the first island-like semiconductors 104 where good crystallinity is provided while avoiding areas near the end parts of the first island-like semiconductors 104. The marker 103 may be maintained so that it can be used for aligning a mask in later steps (forming of gate electrodes, forming of wirings and the like).

In the present invention, a unit circuit is formed using a part corresponding to the second island-like semiconductor A from one first island-like semiconductor, a part corresponding to the second island-like semiconductor B from another first island-like semiconductor, and a part corresponding to the second island-like semiconductor C from the other first island-like semiconductor, of the three first island-like semiconductors 104.

In the present invention, plural second island-like semiconductors constituting a unit circuit are formed from different first island-like semiconductors. When a unit circuit is formed using three second island-like semiconductors, the three second island-like semiconductors are set to have different distances from the pointed end part (a-point). By so setting, the different properties of the second island-like semiconductors can be averaged. As a result, the properties of unit circuits can be equalized.

FIGS. 5A to 5D simply show the foregoing process. In the present invention, plural second island-like semiconductors 306 are formed from a first island-like semiconductor 302. However, FIGS. 5A to 5D show the case where one second island-like semiconductor 306 is formed from the first island-like semiconductor 302, for simplification.

A gate electrode 307 and source and drain wirings 308, 309 are formed on the second island-like semiconductor 306, thus forming a TFT. FIG. 5F is a sectional view along a line A–A' in FIG. 5E.

In the present invention, a known laser can be used as a laser for irradiating the semiconductor. The laser may be a pulse-oscillating or continuously oscillating gas laser or solid laser. As the gas laser, an excimer laser, an Ar laser, a Kr laser or the like may be used. As the solid laser, a YAG laser, a YVO$_4$ laser, a YLF laser, a YAlO$_3$ laser, a glass laser, a ruby laser, an alexandrite laser, a Ti:sapphire laser or the like may be used. Moreover, as a solid laser, a laser using crystals of YAG, YVO$_4$, YLF, a YAlO$_3$ or the like doped with Cr, Nd, Er, Ho, Ce, Co, Ni or Tm may be employed. The fundamental wave of the laser varies depending on the material to dope with, and a laser beam with a fundamental wave of approximately 1 μm is obtained. The harmonic with respect to the fundamental wave is obtained by using a non-linear optical element. Moreover, an ultraviolet laser beam obtained by a non-linear optical element from a green laser beam, which is converted by another non-linear optical element from an infrared laser beam emitted from a solid laser, can be used.

In the present invention, the width of the beam spot can be properly changed in accordance with the size of the first island-like semiconductor or the second island-like semiconductor. For example, a TFT of a driving circuit in which flow of a relative large quantity of current is desired has a large channel width and therefore the size of the second island-like semiconductor tends to be large, compared with a pixel part. Thus, the case of scanning the first island-like semiconductors of two sizes with a laser beam while changing the width of the slit will now be described with reference to FIG. 11.

FIG. 11A shows the relation between a part scanned with a laser beam and the first island-like semiconductor in the case where the first island-like semiconductor has a short length in the direction perpendicular to the scanning direction. FIG. 11B shows the relation between a part scanned with a laser beam and the first island-like semiconductor in the case where the first island-like semiconductor has a long length in the direction perpendicular to the scanning direction.

If the width of a spot 1901 in FIG. 11A is $W_1$ and the width of a spot 1902 in FIG. 11B is $W_2$, $W_1<W_2$ holds. Of course, the width of the spot is not limited to these, and if there is an enough spacing between the first island-like semiconductors in the direction perpendicular to the scanning direction, the width can be freely set.

In the present invention, as shown in FIGS. 11A and 11B, scanning with the spot is carried out so that at least the first island-like semiconductor parts are crystallized, instead of irradiating the laser beam on the entire surface of the substrate. Since the laser beam is not irradiated on the entire surface of the substrate but it is irradiated on the minimum necessary parts to enable crystallization of the first island-like semiconductors, the processing time required for one substrate can be suppressed and the efficiency of substrate processing can be improved.

(Embodiment Mode 2)

Figure 1:
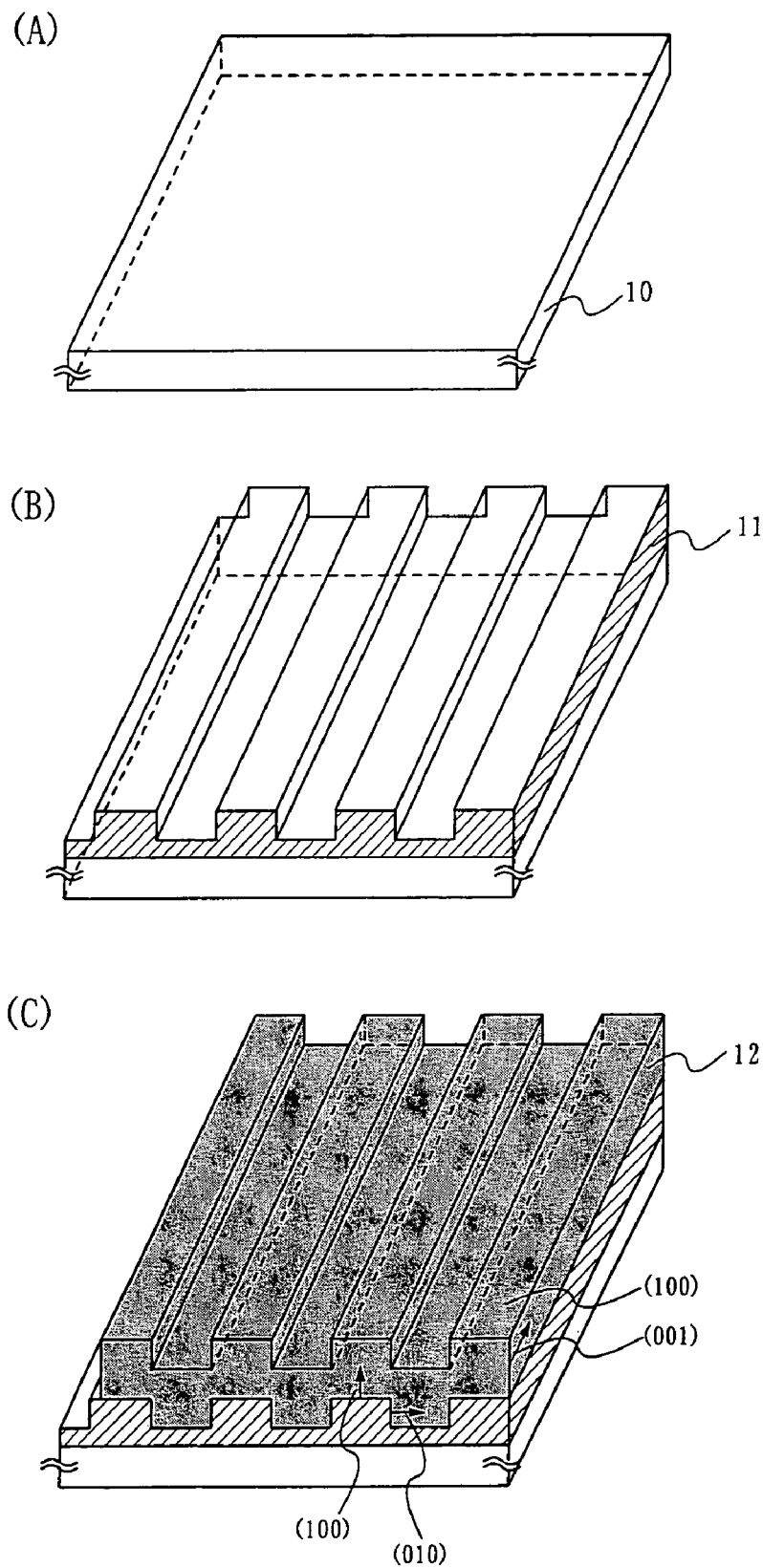
FIGS. 1A–1C are views for explaining an embodiment mode of the present invention in which grapho-epitaxy is used.
Figure 2:
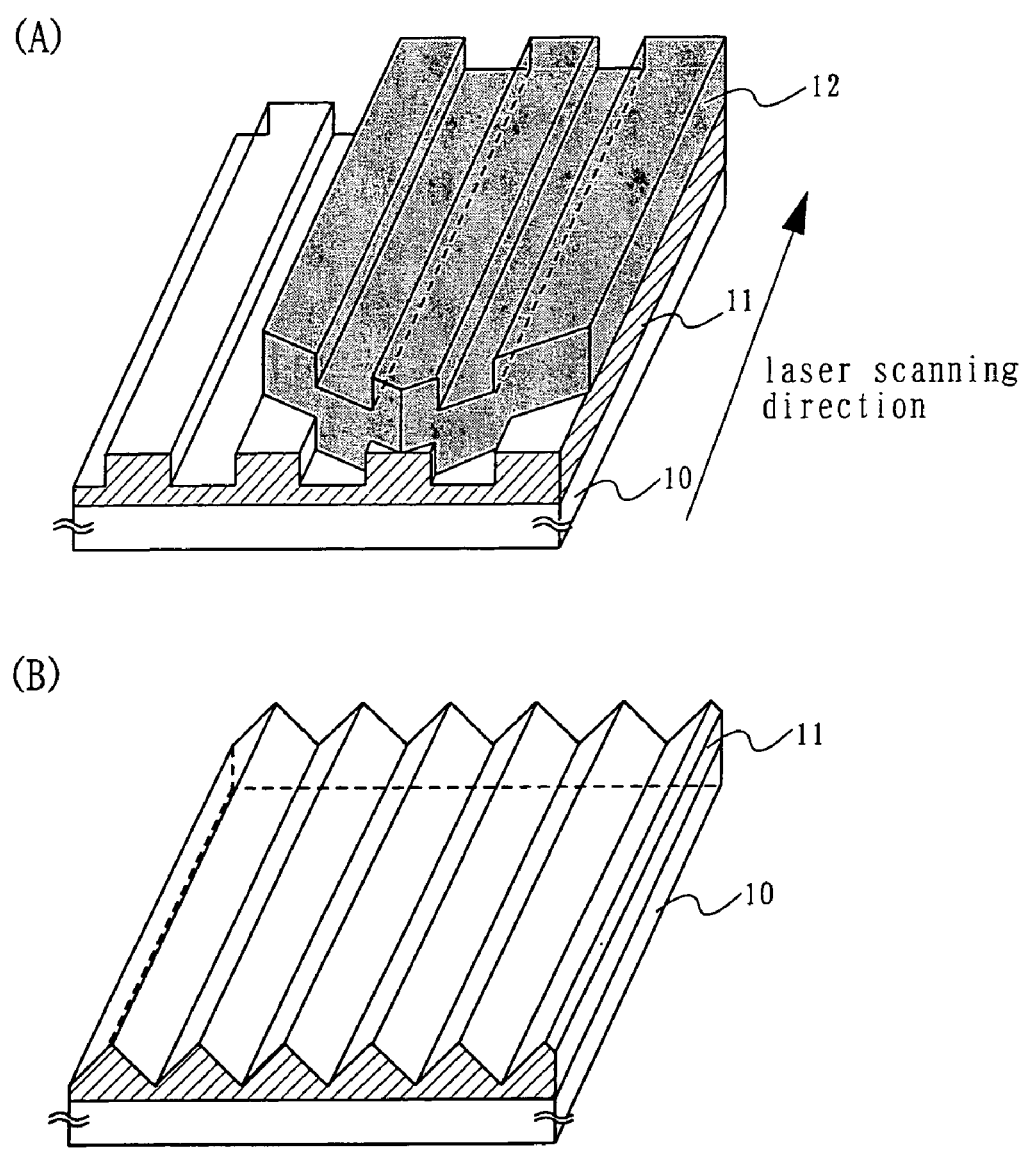
FIGS. 2A–2B are views for explaining an embodiment mode of the present invention in which grapho-epitaxy is used.

In this embodiment mode, as a different embodiment mode from Embodiment Mode 1, a method for preparing a semiconductor device to which the principle of grapho-epitaxy is applied will be described with reference to FIGS. 1 and 2.

The basic principle of grapho-epitaxy utilizes the anisotropy of surface energy held by crystals to be grown. The anisotropy of surface energy means a characteristic such that, for example, crystals of salt grown from a solution exhibit regular hexahedrons. In the case of an SOI structure, it means the anisotropy of surface energy between $SiO_2$ and Si.

In FIG. 1A, 10 represents a substrate. As the substrate 10, any material that is durable to the processing temperature throughout the manufacture of a semiconductor device may be used. For example, a quartz substrate, a silicon substrate, a non-alkaline glass substrate containing barium borosilicate glass or aluminoborosilicate glass or the like, or a substrate having an insulating film formed on a surface of a metal substrate can be used. Also a plastic substrate that is heat-resistant enough to be durable to the processing temperature may be used.

Next, an insulating film 11 is formed on the substrate 10. The insulating film 11 contains an insulating film such as a silicon oxide film, a silicon nitride film, a silicon oxynitride film or the like. As shown in FIG. 1B, the insulating film 11 is formed to have a regular projection and depression pattern. In other words, the insulating film 11 is formed so that a depression and a projection are repeated regularly.

Then, a semiconductor film 12 is formed on the insulating film 11. The semiconductor film 12 is formed on the insulating film 11 having the projection and depression shape. As a result, also the semiconductor film 12 has a depression and projection shape as shown in FIG. 1C.

In the state as described above, a laser beam is irradiated on the semiconductor film 12. Then, the semiconductor film 12 forms crystals having a plane orientation as shown in FIG. 1C. More specifically, as grooves perpendicular to the surface of the substrate 10 are formed, Si contact the side surfaces and bottom surfaces or top surfaces of the grooves and therefore the (100) plane and (010) and (001) planes equivalent thereto, of Si contacting the respective surfaces, are rearranged to be in contact with each other. Therefore, single crystals having the same perpendicular direction to the substrate and the same in-plane direction parallel to the substrate are grown.

The method for manufacturing a semiconductor device of this embodiment mode may be combined with the method for manufacturing a semiconductor device described in Embodiment Mode 1 with reference to FIGS. 3 to 5. In this case, the depression and projection shaped insulating film 11 is formed on the substrate 10, and a semiconductor film is formed on the insulating film 11 and patterned into a desired shape, thus forming the island-like semiconductor layer 12, as shown in FIG. 2A. Irradiating of a laser beam spot is started at a pointed end part (top end) of the island-like semiconductor layer 12. Since crystallization starts at the pointed end part (top end) of the island-like semiconductor layer 12, an island-like semiconductor layer having a better property can be provided.

The shape of the insulating film 11 is not limited to the depression and projection shape as shown in FIG. 2A. For example, it may be a triangular shape as shown in FIG. 2B.

Steps in the method for manufacturing a semiconductor device using the principle of grapho-epitaxy are briefly shown in FIGS. 23 and 24.

In FIG. 23A, an base film 32 is first formed on a substrate 31. As the substrate 31, any material that is durable to the processing temperature throughout the manufacture of a semiconductor device may be used. For example, a quartz substrate, a silicon substrate, a non-alkaline glass substrate containing barium borosilicate glass or aluminoborosilicate glass or the like, or a substrate having an insulating film formed on a surface of a metal substrate can be used. Also a plastic substrate that is heat-resistant enough to be durable to the processing temperature may be used.

The base film 32 is formed on the substrate 31. The base film 32 contains an insulating film such as a silicon oxide film, a silicon nitride film, a silicon oxynitride film or the like. In this case, the base film 32 is formed to have a regular projection and depression pattern as shown in FIG. 23A.

Then, a semiconductor film 33 is formed on the base film 32. The semiconductor film 33 is formed on the base film 32 having the projection and depression shape. As a result, also the semiconductor film 33 has a projection and depression surface as shown in FIG. 23B.

Then, a laser beam 35 is irradiated on the semiconductor film 33. A crystallized semiconductor film 34 is thus formed (FIG. 23C).

Next, the semiconductor film 34 is patterned into a desired shape, thus forming island-like semiconductor layers 36 (FIG. 24A). Gate wirings 37, source and drain wirings 38 and an interlayer insulating film 39 are formed on the island-like semiconductor layers 36 (FIG. 24B).

This embodiment mode can be optionally combined with Embodiment Mode 1.

Embodiment Mode 3

In this embodiment mode, top views in the case where a gate electrode and source and drain wirings are formed on an island-like semiconductor layer formed by using the methods for preparing a semiconductor device described in Embodiment Modes 1 and 2 will be described with reference to FIGS. 6 to 9.

Figure 6:
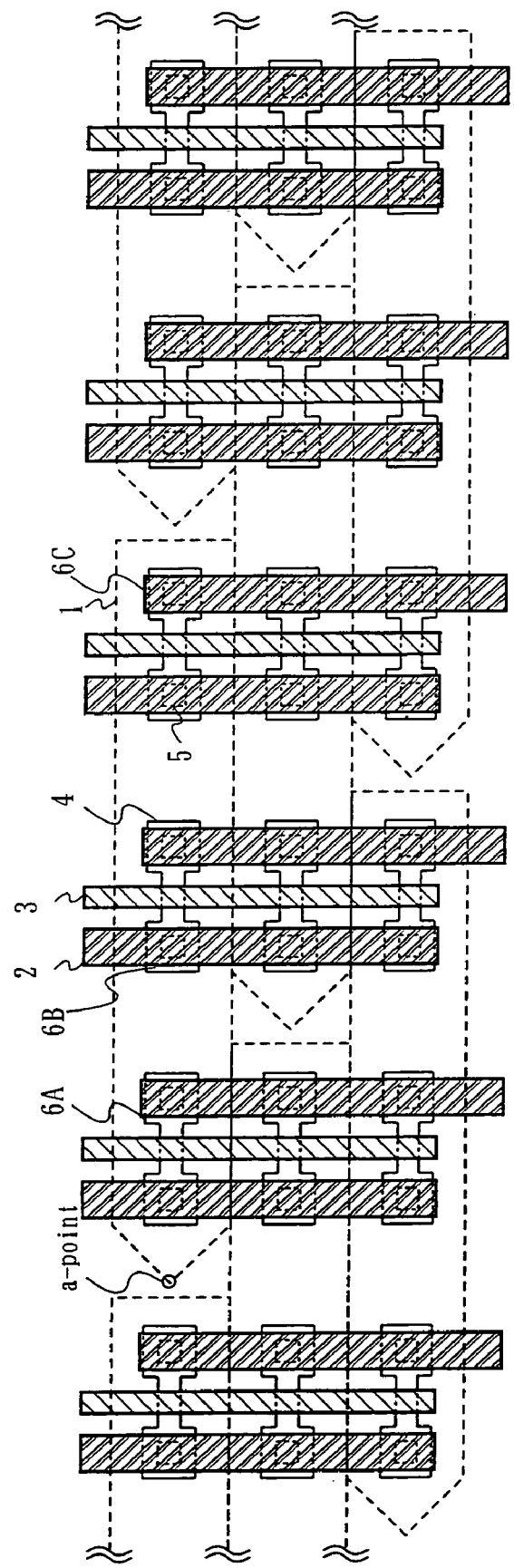
FIG. 6 is a view for explaining an embodiment mode of the present invention.

In FIG. 6, 1 represents a first island-like semiconductor layer, and 2 and 4 represent a source wiring and a drain wiring, respectively or vice versa. 3 represents a gate electrode and 5 represents a contact hole. FIGS. 6A to 6C represent second island-like semiconductor layers.

In FIG. 4A, three second island-like semiconductor layers 105 are formed from a first island-like semiconductor layer 104. In this specification, the three first island-like semiconductor layers, from the side close to a-point, are referred to as second island-like semiconductor layer 6A, second island-like semiconductor layer 6B, and second island-like semiconductor layer 6C. In the present invention, the second island-like semiconductor layer 6A, the second island-like semiconductor layer 6B and the second island-like semiconductor layer 6C in three first island-like semiconductor layers 1 form a circuit, as shown in FIG. 6.

In the present invention, plural second island-like semiconductors constituting a unit circuit are formed from different first island-like semiconductors. On the assumption that three second island-like semiconductors form a unit circuit, the three second island-like semiconductors are set to be at different distances from the pointed end part (a-point). The different properties of the second island-like semiconductors can be thus averaged. As a result, the properties of unit circuits can be equalized.

Figure 7:
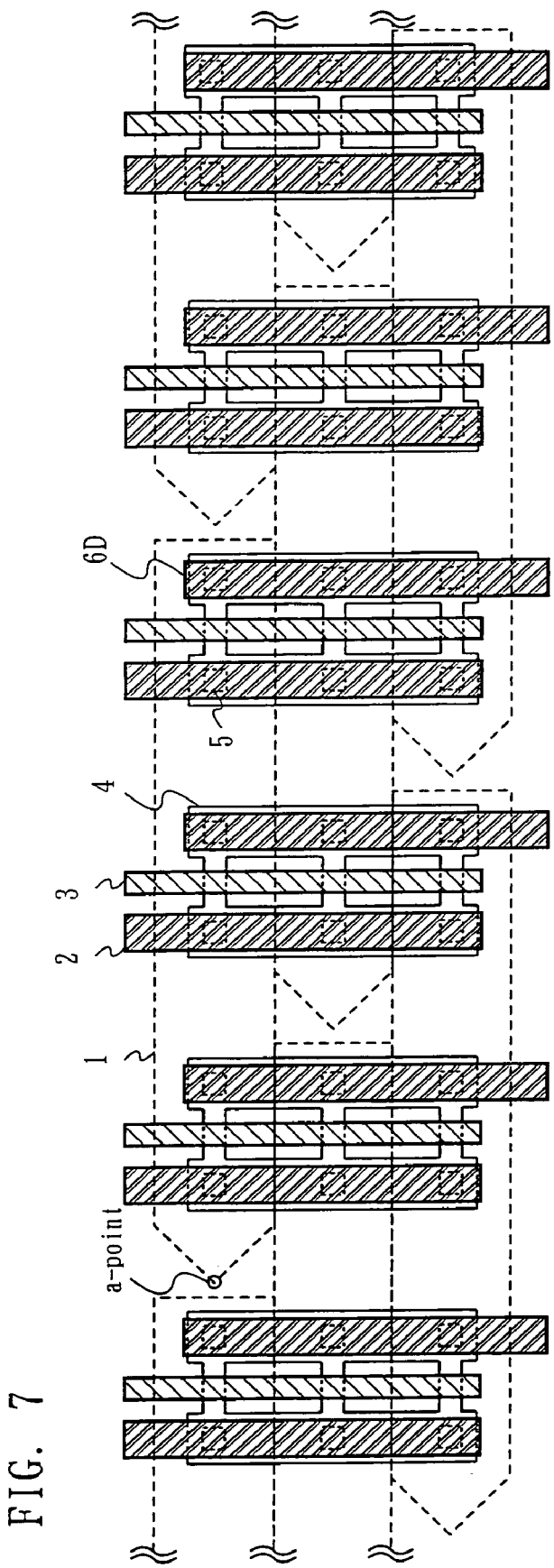
FIG. 7 is a view for explaining an embodiment mode of the present invention.

Further, FIG. 7 shows the case where a multi-channel TFT is formed using three second island-like semiconductor layers. A second island-like semiconductor layer 6D has a structure such that the second island-like semiconductor layers 6A to 6C shown in FIG. 4 are combined. It is preferred that the multi-channel TFT as shown in FIG. 7 is used for the current mirror circuit shown in FIG. 10A.

Figure 8:
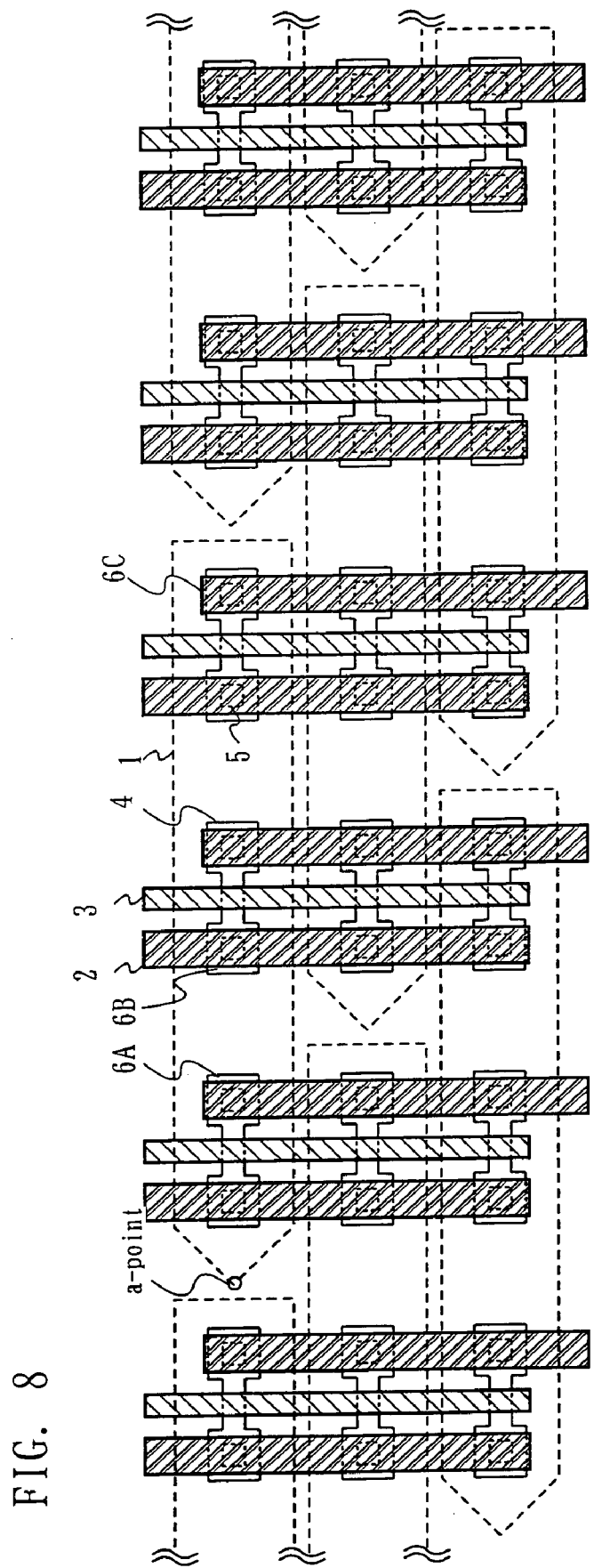
FIG. 8 is a view for explaining an embodiment mode of the present invention.

Next, FIG. 8 shows the case where a TFT is formed using one second island-like semiconductor layer and plural first island-like semiconductor layers 1 are separated.

Finally, FIG. 9 shows a circuit diagram of the semiconductor devices shown in FIGS. 6 to 8.

This embodiment mode can be optionally combined with Embodiment Modes 1 and 2.

EMBODIMENTS

Embodiments of the present invention will now be described.

Embodiment 1

This embodiment describes an example of a laser crystallization process using a CW laser.

A CW laser suitable for the process is one having a wavelength of 550 nm or less and having highly stable output power. For example, the second harmonic of a $YVO_4$ laser, the second harmonic of a YAG laser, the second harmonic of a YLF laser, the second harmonic of a $YAlO_3$ laser, and an Ar laser and the like meet the requirement. Or higher harmonic of these lasers may also be used. Alternatively, a ruby laser, an alexandrite laser, a Ti:sapphire laser, a continuous wave excimer laser, Kr laser, $CO_2$ laser, a continuous wave helium cadmium laser, copper steam laser, gold steam laser or the like may be employed. It is also possible to employ plural lasers of different types chosen from those lasers.

FIG. 12A is a schematic representation of an apparatus for CW laser crystallization. The apparatus includes a laser oscillator 701, a mirror 702, a convex lens 703, an X-Y stage 704, etc. The laser used here is an output 10 W power continuous wave $YVO_4$ laser. The laser oscillator 701 is provided with a non-linear optical element and emits the second harmonic from its exit.

A laser beam emitted from the laser oscillator 701 has a circular shape as indicated by A in FIG. 12A. The laser beam is emitted in the horizontal direction and is deflected by the mirror 702 toward the direction about 20° from the vertical direction. Thereafter, the beam is collected by the convex lens 703 positioned in the horizontal direction. A substrate 705 is fixed to the X-Y stage 704 and an irradiation surface on a semiconductor layer that is formed on the substrate is brought to the focus of the convex lens 703. At this point, the irradiation surface is arranged such that it is in parallel with the convex lens 703. In other words, the substrate 705 is arranged horizontally. The laser beam enters the convex lens 703 at about 20° and therefore the laser beam forms an elliptical shape on the irradiation surface due to astigmatism of the convex lens. The laser beam shape on the irradiation surface is determined by the incident angle at which the laser beam enters the convex lens 703. Accordingly, the laser beam can have an elliptical shape of larger aspect ratio by making it enter the convex lens at a larger angle to the vertical direction. On the other hand, this makes the focal depth shallow and uniform irradiation difficult. The suitable deflection angle is therefore about 20°.

In order to crystallize semiconductor layers on the entire surface of the substrate, it is necessary to repeatedly run an elliptical beam over the substrate at a suitable irradiation pitch while shifting the beam in its longer diameter direction. This operation is achieved by fixing a laser output unit that includes the laser oscillator 701, the mirror 702, and the convex lens 703 using the X-Y stage 704 to move the substrate in a manner that makes the elliptical beam run over the substrate. When the substrate, i.e., the irradiation object, measures 600 mm in the X direction and 720 mm in the Y direction and the elliptical beam measures 200 μm in the longer diameter direction, it requires 3000 times of laser scanning (1500 times of reciprocation) in the direction shown in FIG. 12A to irradiate the entire surface of the substrate.

As described in detail in following embodiments, the number of scanning can be reduced and the processing time can be shortened by using plural laser oscillators and scanning the substrate with plural elliptical beams arranged side by side in the longer diameter direction of the ellipse. Thus, low energy density portions at both the edges of a single laser beam overlap each other at the edges of adjacent laser beams, thereby raising the energy density. As a result, the effective irradiation region is widened and the ratio of the effective irradiation region to the whole irradiation region in one irradiation is increased to further reduce limitations in circuit layout.

This embodiment can be implemented by freely combining with Embodiment Modes 1 to 3.

Embodiment 2

This embodiment gives a description with reference to FIG. 12B on an example of using an optical system different from the one in Embodiment 1 to polarize a laser beam.

A laser beam emitted from a laser oscillator 801 has a circular shape as indicated by A in FIG. 12B. The laser beam is emitted in the horizontal direction and is reflected by a mirror 802 toward the vertical direction. Thereafter, the beam is collected by a first cylindrical lens 803 in the X direction. At this point, the circular shape of the laser beam is collected in the X direction and an elliptical shape with the longer diameter set in the Y direction is formed as indicated by B in FIG. 12B. The laser beam is then collected by a second cylindrical lens 804 in the Y direction. At this point, the laser beam is further collected in the Y direction and an elliptical shape with the longer diameter set in the X direction is formed as indicated by C in FIG. 12B. This optical system can provide an elliptical beam having an aspect ratio even larger than that of the laser beam shown in Embodiment 2. Then, a substrate 806 fixed to an X-Y stage 805 is irradiated Laser beam scanning over the substrate may be performed in the way shown in Embodiment 3.

The number of scanning can be reduced and the processing time can be shortened by using plural laser oscillators and scanning the substrate with plural elliptical beams arranged in parallel side by side in the longer diameter direction of the ellipse. Thus, low energy density portions at both the edges of a single laser beam overlap each other at the edges of adjacent laser beams, thereby raising the energy density. As a result, the effective irradiation region is widened and limitations in circuit layout can be further reduced.

This embodiment can be implemented by freely combining Embodiment Modes 1 to 3 and Embodiment 1.

Embodiment 3

When crystallizing the semiconductor layer by using the CW laser according to the steps described in the embodiment modes, the shape of laser light oscillated by a single laser oscillator on a surface to be irradiated is either elliptical or rectangular. The laser light is converged into a spot state to increase the energy density on the irradiation surface, and the irradiation range is therefore as shown in FIG. 13A.

The energy density is further distributed in the laser light converged into the spot state. FIG. 13B shows an energy distribution in the longitudinal direction and on an X cross-sectional plane, that is, in the longitudinal-axis direction of the ellipse in FIG. 13A.

Figure 13:
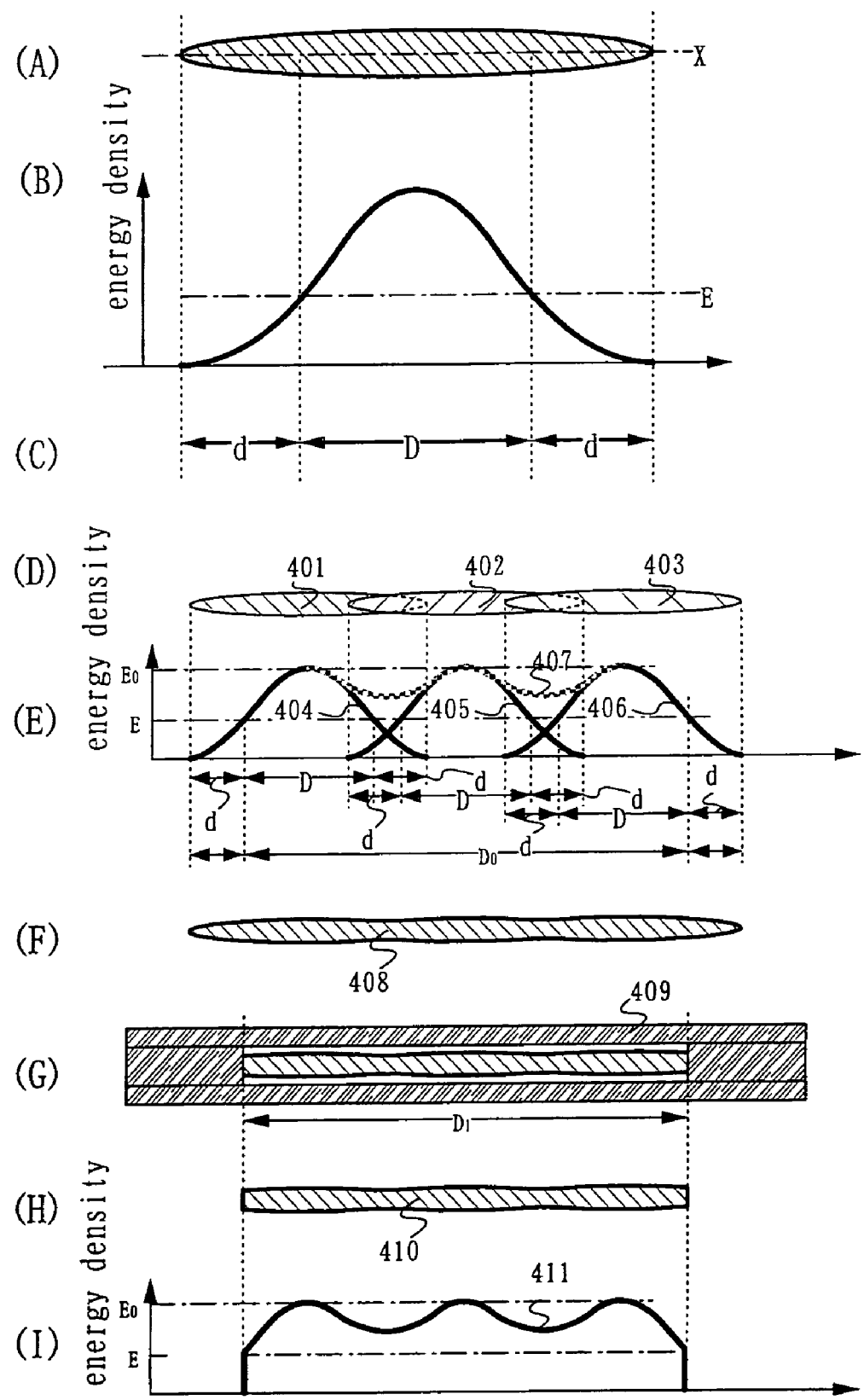
FIGS. 13A–13I are views for explaining an irradiation range of the laser irradiation device.

As is shown in FIG. 13B, in the laser-light spot, a distribution is exhibited such that the energy density gradually decreases in the direction from the central portion to the end portion. In the drawing, the symbol "E" denotes an energy density minimally required for satisfactory crystallization of the semiconductor layer. FIG. 13C shows a state where the semiconductor layer irradiated with laser light in a range D is crystallized satisfactorily, thereby proving that the semiconductor has high electrical characteristics. However, in a region of the semiconductor layer irradiated with laser light in a range d, since the energy density of the laser light is insufficient, melting ability is insufficient, thereby causing micro crystallization. In this region, since sufficient electrical characteristics cannot be obtained, the region is not suitable for use as an active layer.

For manufacturing a plurality of TFTs using the semiconductor layer obtained by patterning the single first island-like semiconductor layer as in the present invention, the range is desirably wider than that of the region D. However, since the increasing of the laser-light spot size is limited, when a circuit is configured within the limited width, difficulties arise in determining the layout of elements. Consequently, wirings and the like need to be led out long, thereby making an inefficient circuit layout.

In this embodiment, an example for implementing efficient laser irradiation by using laser light that is output from a plurality of laser oscillators will be described.

Referring to FIG. 13D, reference numerals 401 to 403 denote spots of laser light that have individually been output from three different laser oscillators and that have been converged into spot states through optical systems. The individual laser-light spots 401 to 403 are synthesized into one laser-light spot, by aligning the longitudinal axes of the individual ellipses linear and partly overlapping with one another.

With reference numerals 404 to 406, FIG. 13E shows energy density distributions of the individual laser-light spots 401 to 403 in the longitudinal-axis direction. The energy densities of the individual spots are identical, in which values of the peaks are denoted by "$E_0$". With regard to the synthesized laser light spot, the energy densities of the overlapped regions are added together, thereby exhibiting energy density distributions as shown with numeral 407 in FIG. 13E.

In this case, the energy densities of the two spots are added together in each of the regions where the adjacent spots 404 and 405 are overlapped and where the adjacent spots 405 and 406 are overlapped. Each of the regions has an energy density that is sufficient for satisfactory crystallization of the semiconductor layer. Therefore, after the synthesization, the shape of the spot is changed into a shape as shown with numeral 408 in FIG. 13F. In this case, a range in which satisfactory crystallization of the semiconductor layer can be performed is as denoted by "$D_0$".

The sum of energy densities of the regions where the adjacent spots are overlapped is ideally identical to the peak value $E_0$ of the single spot. However, the spot-overlapping width may appropriately be set within the range $D_0$ to a value range suitable for obtaining satisfactory and uniform crystallization of the semiconductor layer.

Thus, as can be seen from FIG. 13D and FIG. 13F, the laser irradiation can be implemented with the increased width in the manner that the plurality of laser-light spots are overlapped, and regions of low energy densities are mutually compensated.

Incidentally, use of the synthesized laser light spot is advantageous not only in that a wide area can be scanned, but also in the efficiency. While the width of the irradiated region is (D+2d) when a single laser light spot is used, the width of the irradiated region is ($D_0$+2d) when a synthesized laser light spot as shown in FIG. 13F is used. In the former case, the ratio of the width in which satisfactory crystallization can be performed to one-scanning width of the laser light spot is (D/(D+2d)), whereas the aforementioned ratio is ($D_0/D_0$+2d) in the latter case. Due to D<$D_0$, it can be the that satisfactory crystallization can be implemented more efficiently.

In addition, when using the synthesized laser light spot, as shown in FIG. 13G, the region where the energy density is low, situated at both ends in the longitudinal-axis direction is desirably shielded using a slit 409 not to be incident on the semiconductor layer. At this time, the spot on the surface of the semiconductor layer is shaped as shown in FIG. 13H, the spot is shaped similar to a rectangular having a width of $D_1$(<$D_0$) in the longitudinal-axis direction.

When using the laser light spot shaped as described above to irradiate the semiconductor layer, a region where the energy density is low does not exist in the light spot. Even if such a region exists, the width thereof is very small in comparison to a case without the slit being used and thus facilitates control of the spot position to be performed for preventing irradiation end portions of the laser light spot from being scanned over the first island-like semiconductor layer. Accordingly, the above arrangement enables reductions of constraints on determinations of the laser-light scanning path and the layout of either the first island-like semiconductor layers or the second island-like semiconductor layers.

Furthermore, by using the slit, the width of the laser light spot can be changed with the energy density being maintained constant and without terminating the output of the laser oscillator. Hence, irradiation end portions of the laser light spot can be prevented from being scanned over the second island-like semiconductor layer or the channel formation region thereof. Furthermore, the laser light can be irradiated also onto unnecessary regions of the substrate, thereby enabling effects to be expected for preventing the substrate from being damaged.

The present embodiment can be implemented by freely combining with Embodiment Modes 1 to 3 and Embodiments 1 and 2.

Embodiment 4

Hereinbelow, the configuration including a control system of a laser irradiation device used in the present invention will be described with reference to FIG. 14A. Reference numeral 901 denotes each of a plurality of laser oscillators. While the configuration of FIG. 14A uses three laser oscillators, the number of laser oscillators used for the laser irradiation device is not limited thereto.

The laser irradiation device of FIG. 14A includes a computer 908 that includes a central processing unit and storage means such as a memory. The computer 908 is capable of controlling the oscillation of laser oscillators 901 and moving a substrate to a predetermined position such that the position of the irradiation of a laser light spot onto the substrate 906 is controlled to cause the laser light spot to cover a region determined according to mask-pattern information.

The laser oscillator 901 may maintain the temperature thereof to be constant by using a chiller 902. The chiller 902 need not necessarily be provided. However, by maintaining the temperature of the laser oscillator 901 to be constant, the energy of laser light to be output can be prevented from being varied by the temperature.

Reference numeral 904 denotes an optical system 904 that is capable of converging the laser light in such a manner as to change the path of light that has been output from the laser oscillator 901 and to arrange a shape of the laser light spot. In addition, in the laser irradiation device of FIG. 14A, laser light spots that have been output from the plurality of laser oscillators 901 are partly overlapped with each other through the optical system 904, and can thus be synthesized.

A plurality of AO modulators 903 capable of temporarily and completely blocking the laser light may be provided in light paths between the substrate to be processed and the laser oscillators 901. Alternatively, instead of the AO modulators 903, attenuators may be provided to adjust the energy density of the laser light.

The configuration may be modified such that means 910 for measuring the energy density of the laser light that has been output from the laser oscillator 901 is provided in the light path between the substrate 906 which is an object to be processed and the laser oscillator 901, and variations with time in the measured energy density are monitored using the computer 908. In this case, the output of the laser oscillator 901 may be increased to compensate for attenuation in the energy density of the laser light.

The synthesized laser light spot is irradiated onto the substrate 906 which is an object to be processed via the slit 905. Desirably, the slit 905 is capable of blocking the laser light, and is formed of a material having sufficient resistance against damage or deformation that can be caused by laser light. In addition, the slit width of the slit 905 is variable so that the width of the laser light spot can be changed according to the slit width.

When laser light oscillated by the laser oscillator 901 is not passed through the slit 905, the shape of the laser light spot on the substrate 906 is variable depending on the laser type, and can be rectified through the optical system.

The substrate 906 is mounted on an X-Y stage 907. In FIG. 14A, the X-Y stage 907 is controlled by a computer, and the irradiation position of the laser light spot is controlled by moving the object to be processed, that is, the substrate 906.

In the present invention, according to the computer 908, the width of the slit 905 is controlled, and the width of the laser light spot can be changed according to pattern information of a mask.

In addition, the laser irradiation device shown in FIG. 14A may include means for adjusting the temperature of the object to be processed. Further, since the laser light has high directivity and energy density, a damper may be provided to prevent reflected light from being irradiated onto an inappropriate portion. Desirably, the damper has a property of adsorbing reflected light, and cooling water is circulated in the damper to prevent the temperature of partition walls from being risen due to the absorption of reflected light. In addition, means (substrate-heating means) for heating the substrate 906 may be provided to the X-Y stage 907.

In a case where the alignment marker is to be formed using the laser, a marker-dedicated laser oscillator may be provided. In this case, oscillation of the marker-dedicated laser oscillator may be controlled using the computer 908. In the case where the marker-dedicated laser oscillator is provided, a separate optical system should be provided to converge laser light emitted from the marker-dedicated laser oscillator. A YAG laser and a $CO_2$ laser are representative lasers that are used for the formation of the marker. Of course, a different laser can be used to form the marker.

One CCD camera 909 may be provided to perform alignment by using the marker. Depending on the necessity, two or more CCD cameras 909 may be provided.

Even when no specific marker is provided, the alignment can be performed by recognizing the pattern of the first island-like semiconductor layer by means of the CCD camera 909. Mask-attributed pattern information of the first island-like semiconductor layer that has been input to the computer 908 is compared with the actual pattern information of the first island-like semiconductor layer that has been stored in the CCD camera 909. As a result, information regarding the position of the substrate can be obtained. In this case, no specific marker needs to be provided.

With reference to FIG. 14A, the configuration including the plurality of laser oscillators has been described, but the configuration may be modified to include one laser oscillator. FIG. 14B shows the configuration of a laser irradiation device using one laser oscillator. Referring to FIG. 14B, numeral 901 denotes a laser oscillator, and numeral 902 denotes a chiller. Numeral 910 denotes an energy density measuring device, numeral 903 denotes an AO modulator, numeral 904 denotes an optical system, a numeral 905 denotes a slit, and numeral 909 denotes a CCD camera. A substrate 906 is mounted on an X-Y stage 907, whereby the position of irradiation of a laser light spot onto a substrate 906 is controlled. Similar to the configuration shown in FIG. 14A, operations of the individual means included in the laser irradiation device are controlled by the computer 908. Dissimilar to the configuration of FIG. 14A, however, the present configuration includes the one laser oscillator.

Accordingly, unlike the configuration of FIG. 14A, also the optical system 904 may be provided with a function to converge laser light emitted from one laser source.

Figure 15:
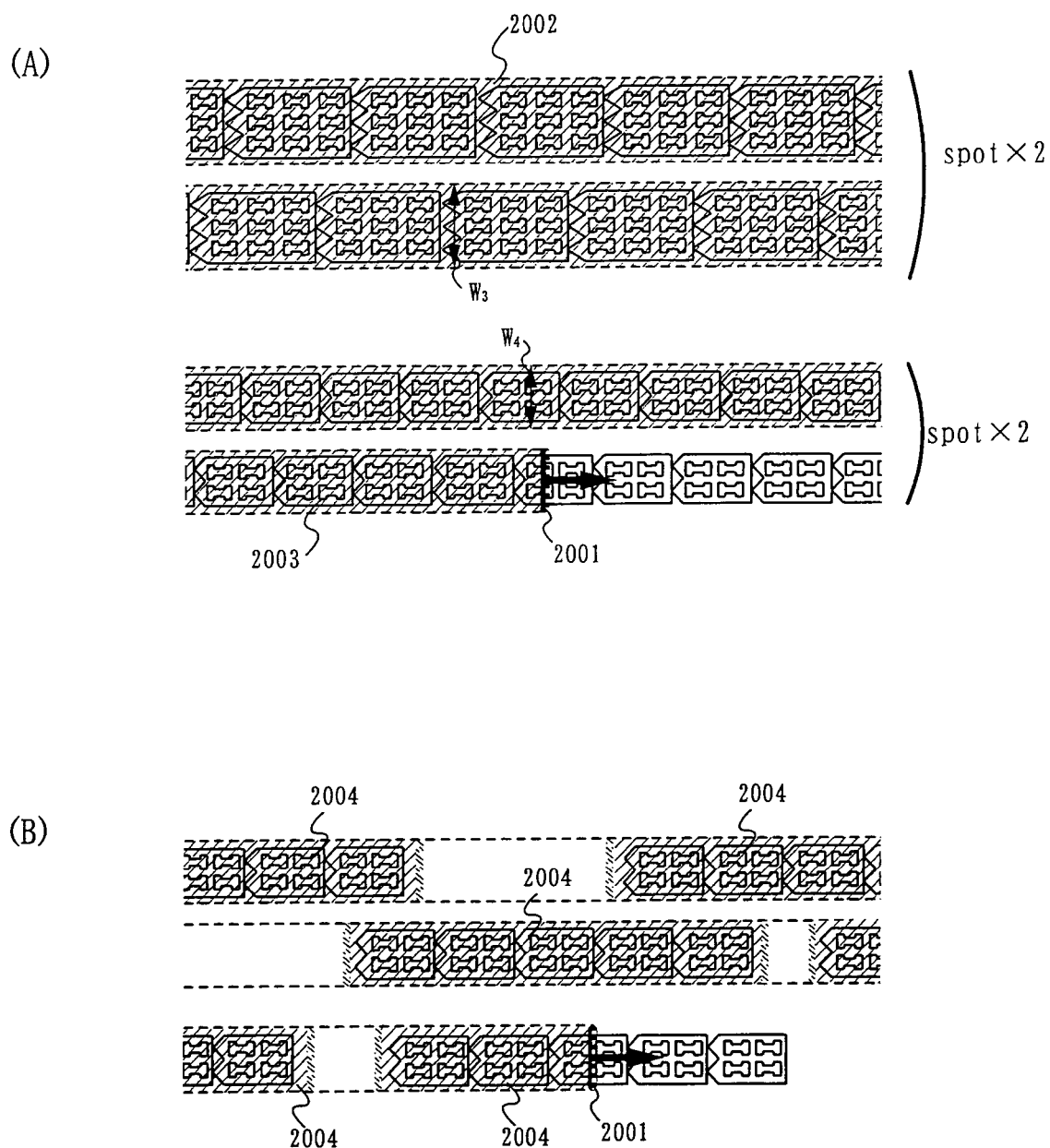
FIGS. 15A–15B are views for explaining a laser irradiation on a semiconductor layer.

FIG. 15A shows an example of the relationship between the shape of mask for patterning a semiconductor layer and the width of a laser light spot 2001 when laser light is irradiated one time. Numeral 2002 denotes a portion scanned with a beam spot having a width $W_3$ obtained by synthesizing overlapped beams of laser light that have been output from four laser oscillators. Numeral 2001 denotes a portion scanned with a beam spot having a width $W_4$ obtained by synthesizing overlapped beams of laser light that have been output from three laser oscillators. The scanning width may be controlled through the slit; or output of a portion of the laser light may be stopped, or may be blocked using the AO modulator.

As in this embodiment, when the AO modulator is used, the width of the laser light spot 2001 can arbitrarily be changed without terminating output operations of all the laser oscillators. This enables the output to be prevented from being unstable due to termination of the output operation of the laser oscillator.

According to the configuration described above, since the width of the trail of the laser light can be changed, even when the width of the first island-like semiconductor layer is partly different as shown in FIG. 15A, edges of the trail of the laser light can be prevented from overlapping a semiconductor that is obtained by a patterning process. In addition, this embodiment enables the reduction in the probability of causing damage occurring on the substrate because of irradiation of the laser light onto unnecessary portions.

Hereinbelow, a description will be made regarding an example in which laser light is blocked by the AO modulator during laser-light irradiation so that the laser light is irradiated only onto a predetermined portion. While the laser light is thus blocked, the present invention is not limited thus, and any other means capable of blocking the laser light may be used.

In the present invention, portions scanned with the laser light are grasped by the computer according to the mask information that has been input. In addition, in this embodiment, the AO modulator is used to block the laser light to be irradiated only onto a (predetermined) portion required to be scanned. In this case, the AO modulator is desirably capable of blocking the laser light and is formed of a material having sufficient resistance against deformation or damage that can be caused by the laser light.

FIG. 15B shows an example of the relationship between the shape of a mask for patterning a semiconductor layer and portions irradiated with the laser light. Reference numeral 2001 denotes a laser light spot, and reference numeral 2004 denotes portions irradiated with the laser light. As shown in FIG. 15B, when scanning the portion where the first island-like semiconductor layer is not formed, the laser light is blocked by the AO modulator, and the laser light is therefore not irradiated onto the substrate. According to this embodiment, the laser light can be controlled not to be irradiated onto a portion that need not be crystallized; and even when the laser light has been irradiated thereonto, the energy density of the laser light can be controlled low. Therefore, this embodiment enables further reduction in the probability of causing damage occurring on the substrate due to irradiation of the laser light onto unnecessary portions.

The present embodiment can be implemented by freely combining with Embodiment Modes 1 to 3 and Embodiments 1 to 3.

Embodiment 5

In this embodiment, a process flow of steps in a semiconductor-device manufacturing method of the present invention will be described.

Figure 16:
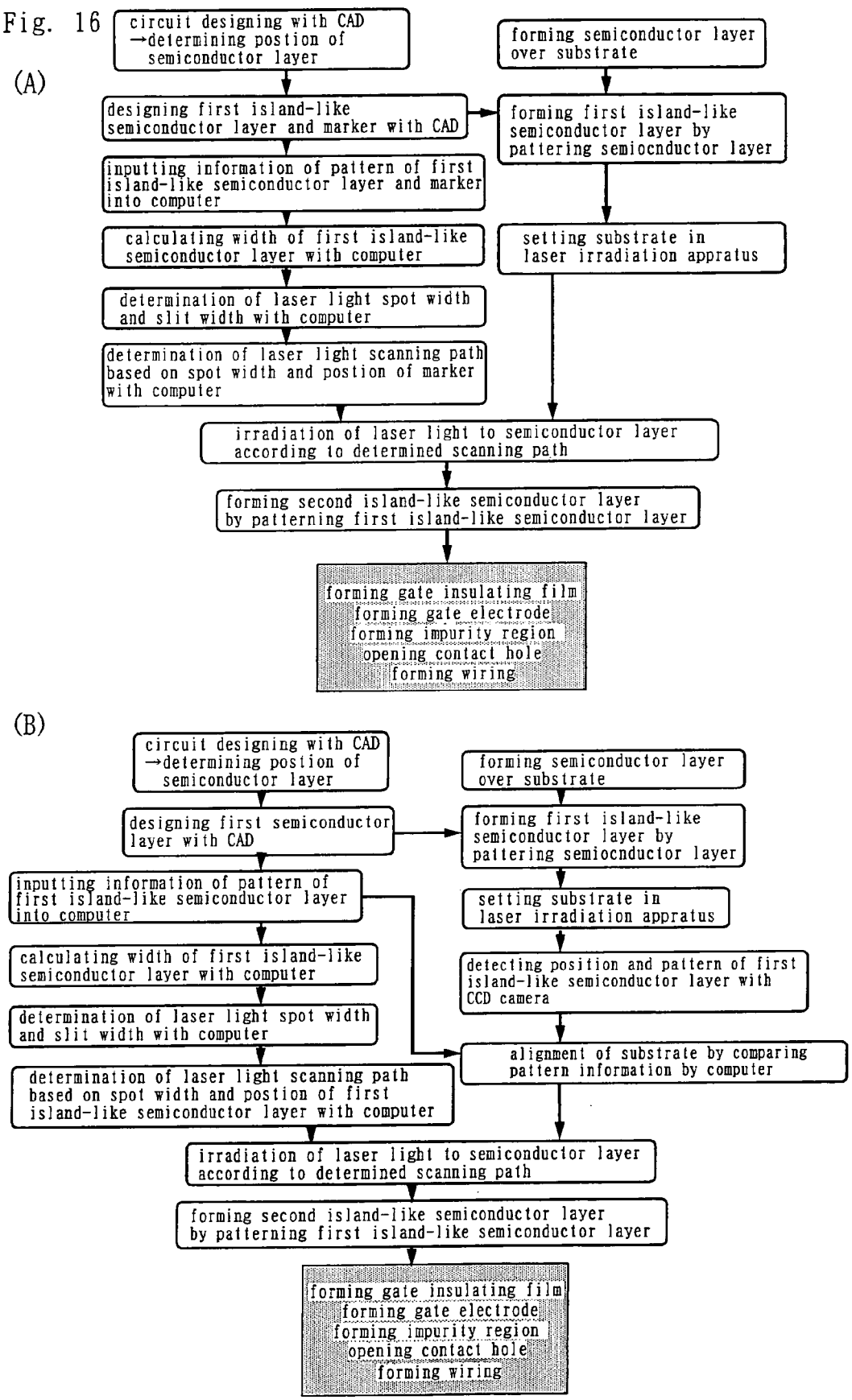
FIGS. 16A–16B are views for explaining process flows including crystallization by laser irradiation on a semiconductor layer.

FIG. 16A shows a process flow of manufacturing steps. First, a CAD (computer aided design) system is used to design a circuit of a semiconductor device. When a circuit layout has been determined, that is, when TFT layout has been determined, the forming position of the each second island-like semiconductor layer is concurrently determined. In this case, the second island-like semiconductor layer, which is included in one first island-like semiconductor layer, is desirably determined to be positioned such that the charge movement direction in the channel forming region is either aligned parallel to the scanning direction of the laser light or is aligned along an equivalent direction. However, the direction may not intentionally be aligned depending on the usage.

In addition, in the above step, a mask of the first island-like semiconductor layer may be designed so that a marker is formed together with the first island-like semiconductor layer.

Subsequently, information regarding the pattern of the mask (pattern information) of the designed first island-like semiconductor layer is entered into the computer included in the laser irradiation device. According to the entered pattern information of the first island-like semiconductor layers, the computer calculates the width of the each first island-like semiconductor layer in the vertical direction to the scanning direction. Then, the width of the slit in the vertical direction to the scanning direction is set according to the width of the each first island-like semiconductor layer.

Subsequently, according to the slit width, a scanning path of the laser light is determined based on the marker position as a reference.

On the other hand, films are deposited on the semiconductor substrate, the mask of the first island-like semiconductor layers is used to pattern the semiconductor layer, and the first island-like semiconductor layers are then formed. Subsequently, the substrate on which the first island-like semiconductor layers are formed is set over the stage of the laser irradiation device.

Subsequently, using the marker as a reference, the laser light is irradiated along the determined scanning path, and crystallization is performed targeting the first island-like semiconductor layer.

After the laser light has been irradiated, patterning is performed for the first island-like semiconductor layer enhanced in the crystallinity according to the laser-light irradiation, and second island-like semiconductor layers are then formed. Thereafter, steps of manufacturing a TFT from the second island-like semiconductor layer are performed. Specifically, TFT-manufacturing steps are variable depending on the shape of the TFT. Representatively, however, a gate insulating film is deposited, and an impurity region is formed in the second island-like semiconductor layer. Subsequently, an interlayer insulating film is formed in such a manner as to cover the gate insulating film and a gate electrode, and contact holes are formed through the interlayer insulating film, and the impurity region is partly exposed. Then, wirings are formed on the interlayer insulating film to be in contact with the impurity region through the contact holes.

Next, a description will be given regarding an example procedure of performing alignment of the substrate and the mask by using the CCD camera, without forming an alignment marker.

FIG. 16B shows a process flow of manufacturing steps. First, similar to the case of FIG. 16A, a CAD system is used to design a circuit of a semiconductor device. When a circuit layout has been determined, that is, when TFT layout has been determined, the forming position of the each second island-like semiconductor layer is concurrently determined. In this case, the second island-like semiconductor layer, which is included in one first island-like semiconductor layer, is desirably determined to be positioned such that the charge movement direction in the channel forming region is either aligned parallel to the scanning direction of the laser light or is aligned along an equivalent direction. However, the direction may not intentionally be aligned depending on the usage.

Subsequently, information regarding the pattern of the mask (pattern information) of the designed first island-like semiconductor layer is entered into the computer included in the laser irradiation device. According to the entered pattern information of the first island-like semiconductor layers, the computer calculates the width of the each first island-like semiconductor layer in the vertical direction to the scanning direction. Then, the width of the slit in the vertical direction to the scanning direction is set according to the width of the each first island-like semiconductor layer.

On the other hand, the semiconductor layers are deposited on the substrate, the mask of the first island-like semiconductor layers is used to pattern the semiconductor layer, and the first island-like semiconductor layers are then formed. Subsequently, the substrate on which the first island-like semiconductor layers are formed is set over the stage of the laser irradiation device.

Subsequently, pattern information of the first island-like semiconductor layers formed on the substrate set over the stage is detected by the CCD camera, and is then input as information to the computer. The computer compares two pieces of information. One of the two pieces of information is the pattern information of the first island-like semiconductor layer designed by the CAD system; and the other is the CCD-camera-obtained pattern information of the first island-like semiconductor layer actually formed on the substrate. As a result, the substrate and the mask are aligned with each other.

Subsequently, a scanning path of the laser light is determined according to the slit width and the CCD-camera-obtained position information of the first island-like semiconductor layer.

Then, the laser light is irradiated along the determined scanning path, and crystallization is performed targeting the first island-like semiconductor layer.

After the laser light has been irradiated, patterning is performed for the first island-like semiconductor layer enhanced in the crystallinity, and second island-like semiconductor layers are then formed. Thereafter, the steps of manufacturing a TFT from the second island-like semiconductor layer are performed. Specifically, TFT-manufacturing procedure is variable depending on the shape of the TFT. Representatively, however, a gate insulating film is deposited, and an impurity region is formed in the second island-like semiconductor layer. Subsequently, an interlayer insulating film is formed in such a manner as to cover the gate insulating film and a gate electrode, and contact holes are formed through the interlayer insulating film, and the impurity region is partly exposed. Then, wirings are formed on the interlayer insulating film to be in contact with the impurity region through the contact holes.

Next, an example method according to which laser-light irradiation is performed multiple times will be described. As an example, a description will be made with reference to a method of performing second-time laser irradiation by changing the direction after laser irradiation has been performed one time.

FIG. 17A shows a process flow of manufacturing steps. First, a CAD system is used to design a circuit of a semiconductor device. When a circuit layout has been determined, that is, when TFT layout has been determined, the forming position of each second island-like semiconductor layer is concurrently determined. In this case, the second island-like semiconductor layer, which is included in one first island-like semiconductor layer, is desirably determined to be positioned such that the charge movement direction in the channel forming region is either aligned parallel to the scanning direction of the laser light or is aligned along an equivalent direction. However, the direction may not intentionally be aligned depending on the usage.

Subsequently, information regarding the pattern of the mask (pattern information) of the designed first island-like semiconductor layer is entered into the computer included in the laser irradiation device. According to the entered pattern information of the first island-like semiconductor layers, the computer calculates two widths of the each first island-like semiconductor layer in the vertical direction to each of the two scanning directions. Then, the widths of the slit in the vertical direction to each of the two scanning directions are calculated according to the widths of the each first island-like semiconductor layer.

Subsequently, based on each of the determined slit widths, scanning paths of the laser light are determined in the individual two scanning directions according to the marker position as a reference.

On the other hand, the semiconductor layers are formed on the substrate, the mask of the first island-like semiconductor layers is used to pattern the semiconductor layer, and the first island-like semiconductor layers are then formed. Subsequently, the substrate on which the first island-like semiconductor layers are formed is set over the stage of the laser irradiation device.

Subsequently, using the marker as a reference, first laser light is irradiated along the first one of the two scanning paths that have been determined, and crystallization is performed targeting the first island-like semiconductor layer.

Subsequently, after changing the scanning direction, second laser light is irradiated along the second scanning path, and crystallization is performed targeting the first island-like semiconductor layer.

The angles of the scanning directions of the first laser light and second laser light may either be pre-stored in a memory or the like or manually be entered each time.

FIG. 17A shows an example method according to which the laser light is irradiated two times to the same first island-like semiconductor layer. However, with an AO modulator or the like being used, the scanning direction can be changed by specifying positions. For example, a case is assumed such that the scanning direction in a signal-line drive circuit is set different from the scanning direction in a pixel portion and a scan-line drive circuit. In this case, when an AO modulator is used to irradiate laser light to a position where the signal-line drive circuit is formed, the laser light can be controlled using the AO modulator not to be irradiated onto positions where the pixel portion and scan-line drive circuit are formed. When an AO modulator is used to irradiate laser light onto a position where the pixel portion and a scan-line drive circuit are formed, the laser light can be controlled using the AO modulator not to be irradiated onto a position where the signal-line drive circuit is formed. In this case, the AO modulator is controlled by the computer to operate in synchronization with position control means.

After the laser light has been irradiated, patterning is performed for the first island-like semiconductor layer enhanced in the crystallinity, and second island-like semiconductor layers are then formed. Thereafter, steps of manufacturing a TFT from the second island-like semiconductor layer are performed. Specifically, TFT-manufacturing steps are variable depending on the shape of the TFT. Representatively, however, a gate insulating film is deposited, and an impurity region is formed in the second island-like semiconductor layer. Subsequently, an interlayer insulating film is formed in such a manner as to cover the gate insulating film and a gate electrode, and contact holes are formed through the interlayer insulating film, and the impurity region is partly exposed. Then, wirings are formed on the interlayer insulating film to be in contact with the impurity region through the contact holes.

For comparison, FIG. 17B shows a process flow of manufacturing steps for a conventional semiconductor layers. As shown in FIG. 17B, a CAD system is used to design a mask of a semiconductor device. On the other hand, an amorphous semiconductor layer is deposited on the substrate, and a substrate on which the amorphous semiconductor layer is formed is set over the laser irradiation device. Subsequently, scanning is performed so that laser light is irradiated onto the entire surface of the amorphous semiconductor layer, and the amorphous semiconductor layer is thus crystallized. Then, an alignment marker is formed on a polycrystalline semiconductor layer thus obtained through crystallization, and the polycrystalline semiconductor layer is patterned using the alignment marker as a reference. In this manner, second island-like semiconductor layers are formed. Subsequently, TFTs are formed using the second island-like semiconductor layers.

As described above, dissimilar to the conventional case shown in FIG. 17B, according to the present invention, the alignment marker is formed using the laser light before the amorphous semiconductor layer is crystallized. Thereafter, the laser light is scanned according to the information of the mask for patterning the semiconductor layers.

According to the configuration described above, there can be reduced a time for irradiating the laser light to portions that are to be excluded by pattering among the semiconductor layers on the substrate. Consequently, the time for laser-light irradiation can be reduced, and in addition, the substrate-processing speed can be improved.

The method may include a step of crystallizing the semiconductor film by using a catalyst prior to the step of crystallization using the laser light. When using a catalytic element, a technique disclosed in either JP 07-130652 A and/or JP 08-78329 A is desirably employed.

The method including the step of crystallizing the semiconductor layer by using a catalyst includes a step of performing Ni-using crystallization (NiSPC) after deposition of an amorphous semiconductor layer. For example, when employing the technique disclosed in JP 07-130652 A, a nickel-containing layer is formed by coating an amorphous semiconductor layer with a nickel acetate solution containing nickel 10 ppm by weight. The nickel-containing layer is subjected to a step of dehydrogenation at 500° C. for one hour, and is then subjected to heat treatment at 500 to 650° C. for 4 to 12 hours, for example, at 550° C. for 8 hours. In this case, in addition to nickel (Ni), usable catalytic elements such as germanium (Ge), ferrous (Fe), palladium (Pd), tin (Sn), lead (Pb), cobalt (Co), platinum (Pt), copper (Cu), and gold (Au) may be used.

The crystallinity of the semiconductor layer crystallized according to the NiSPC is further enhanced through laser-light irradiation. Since a polycrystalline semiconductor layer obtained through the laser-light irradiation contains the catalytic element, the layer is subjected to a step (gettering step) of removing the catalytic element from the amorphous semiconductor layer after the laser irradiation. The gettering step may be performed using a technique disclosed in JP 10-135468 A or JP 10-135469 A.

Specifically, phosphorous is partly added to the polycrystalline semiconductor layer obtained after the laser-light irradiation, and heat treatment is performed at 550 to 800° C. for 5 to 24 hours, for example, at 600° C. for 12 hours, in a nitrogen atmosphere. As a result, a phosphorous-added region of the polycrystalline semiconductor layer works as a gettering site, thereby enabling phosphorous existing in the polycrystalline semiconductor layer to segregate to the gettering site. Thereafter, the phosphorous-added region of the polycrystalline semiconductor layer is removed by patterning. Consequently, the processes as described above enables the production of a second island-like semiconductor layers that have a catalytic-element concentration reduced below $1 \times 10^{17}$ atms/cm$^3$, preferably to a level of $1 \times 10^{16}$ atms/cm$^3$.

The present embodiment can be implemented by freely combining with Embodiment Modes 1 to 3 and Embodiments 1 to 4.

Embodiment 6

In this embodiment, circuit layouts on substrates, CW laser irradiation directions, and the like will be described with reference to some examples.

Generally, a display device is configured as an example shown in FIG. 18A. The general example display device is configured to include a pixel portion 1401 in a central portion of a substrate 1400, a source-signal-line drive circuit 1402 in an upper or lower portion of the pixel portion 1401, and a gate-signal-line drive circuit 1403 in any one of left and right portions of the pixel portion 1401 or in both of the left and right portions of the pixel portion 1401. A signal and power for driving the each drive circuit is input via a flexible printed circuit (FPC) 1404 from the outside of the substrate.

As shown in FIG. 18A, the source-signal-line drive circuit 1402 is disposed extending in a pixel-column direction, and the gate-signal-line drive circuit 1403 is disposed extending in a pixel-line direction. Therefore, in a case where CW laser irradiation is performed as described in the Embodiment Modes, when the irradiation direction is aligned along the disposition direction of the source-signal-line drive circuit, as shown in FIG. 18B, the irradiation direction of the CW laser is not aligned to the disposition direction of the gate-signal-line drive circuit. Generally, however, in comparison to a source-signal-line drive circuit for which high-speed driving is required, the driving frequency of a gate-signal-line drive circuit may be about one-several hundredth. Accordingly, even if active layers of TFTs constituting the gate-signal-line drive circuit are formed to include portions of microcrystalline semiconductor layers, it can be said that no problems would occur with the circuit operation.

FIG. 18C illustrates another usable method in which the scanning direction is shifted on the way. Specifically, first laser scanning is first performed in alignment with the source-signal-line drive circuit. Then, a stage on which the substrate is fixed is rotated 90 degrees, the laser scanning direction is thus changed, and second CW laser irradiation is then performed in alignment to the gate-signal-line drive circuit and the pixel portion.

FIG. 18D illustrates still another usable method using a technique disclosed in Japanese Patent Application No. 2001-241463. In this case, a source-signal-line drive circuit 1402 and a gate-signal-line drive circuit 1403 are either disposed on one side of a pixel portion or are disposed parallel to each other on the opposing two sides of the pixel portion. As a result, as shown in FIG. 14E, crystallization can be completed by one-time CW laser irradiation; and concurrently, the pixel portion and a semiconductor layer in a drive circuit can be configured only by unidirectional laser-light irradiation.

The above described method in this embodiment is only one example of many methods. For example, a method may be used in which only a drive circuit portion for which high-speed driving is required is crystallized by the laser-light irradiation, and a pixel portion and the like for which the requirement level for high-speed driving is relatively low are manufactured using a conventional crystallization method. Meanwhile, this embodiment may be implemented in combination with other embodiments.

The present embodiment can be implemented by freely combining with Embodiment Modes 1 to 3 and Embodiments 1 to 5.

Embodiment 7

In this embodiment, a method of manufacturing an active matrix substrate will be described with reference to FIGS. 19 and 20. A substrate on which a drive circuit including a CMOS circuit and a pixel portion are formed together is referred to as active matrix substrate for convenience.

First of all, a substrate 5001 formed of glass such as barium borosilicate glass and aluminum borosilicate glass is used in this embodiment. The substrate 5001 may be a quartz substrate, a silicon substrate, a metal substrate or stainless substrate which has an insulating film on the surface. The substrate 5001 may be a plastic substrate having heat resistance, which withstands a processing temperature in this embodiment.

Next, a base film 5002 having an insulating film such as silicon oxide film, silicon nitride film, and a silicon oxynitride film is formed on the substrate 5001 by publicly known method (such as the sputtering, LPCVD and plasma CVD). In this embodiment, a two-layer structure composing base films 5002a and 5002b is used for the base film 5002. However, a structure may be used where a single layer film is used or at least two layers are stacked.

Next, semiconductor layer 5003 is formed with a thickness of 25 to 80 nm (preferably 30 to 60 nm) by publicly known method (such as the sputtering, LPCVD and plasma CVD) on the base film 5002. The semiconductor layer may be an amorphous semiconductor layer, a micro crystal semiconductor layer or a crystalline semiconductor layer. Alternatively, the semiconductor layer may be a compound semiconductor layer having an amorphous structure such as an amorphous silicon germanium film (FIG. 19A).

The semiconductor layer 5003 is patterned. And the first island-like semiconductor layers 5004 to 5006 are formed by the anisotropic dry etching (the first etching treatment) in an atmosphere containing halogen fluoride, for example, ClF, $ClF_3$, BrF, $BrF_3$, IF, $IF_3$, and the like (FIG. 19B).

Then, the first island-like semiconductor layers 5004 to 5006 are crystallized by laser crystallization method. In the case that the semiconductor layer is a micro crystal semiconductor layer or crystalline semiconductor layer, its crystallinity of the island-like semiconductor layers is enhanced by conducting this step. The laser crystallization method is conducted by using the laser irradiation method described in Embodiment Modes and Embodiments 1 to 6. Specifically, the first island-like semiconductor layers 5004 to 5006 are selectively subjected to laser light according to the mask information inputted to a computer of the laser irradiation apparatus. Of course, in addition to the laser crystallization method, the semiconductor layer may be crystallized by combining other publicly known crystallization method (such as thermal crystallization method using RTA or a furnace annealing kiln and thermal crystallization method using a metal element facilitating the crystallization).

When a crystallization of a semiconductor layer is conducted, it is preferable that the second harmonic through the fourth harmonic of basic waves is applied by using the solid state laser which is capable of continuous oscillation in order to obtain a crystal in large grain size. Typically, it is preferable that the second harmonic (with a wavelength of 532 nm) or the third harmonic (with a wavelength of 355 nm) of an $Nd:YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator may be used. Then, more preferably, the laser beams are formed on an irradiation surface so as to have a rectangular shape or an elliptical shape through an optical system, thereby irradiating a substance to be treated. At this time, the energy density of approximately 0.01 to 100 $MW/cm^2$ (preferably 0.1 to 10 $MW/cm^2$) is required. The substrate 5001 on which semiconductor film is formed is moved at approximately 10 to 2000 cm/s rate relatively corresponding to the laser beams so as to irradiate the semiconductor film.

Note that, a gas laser or solid-state laser of continuous oscillation type or pulse oscillation type can be used. The gas laser such as an excimer laser, Ar laser, Kr laser and the solid-state laser such as YAG laser, $YVO_4$ laser, YLF laser, $YAlO_3$ laser, glass laser, ruby laser, alexandrite laser, Ti:sapphire laser can be used as the laser beam. Also, crystals such as YAG laser, $YVO_4$ laser, YLF laser, $YAlO_3$ laser wherein Cr, Nd, Er, Ho, Ce, Co, Ti or Tm is doped can be used as the solid-state laser. A basic wave of the lasers is different depending on the materials of doping, therefore a laser beam having a basic wave of approximately 1 μm is obtained. A harmonic corresponding to the basic wave can be obtained by the using non-linear optical elements.

The first island-like semiconductor layers 5004 to 5006 are subjected to laser light and enhanced the crystallinity by the above mentioned laser crystallization (FIG. 19C).

The second island-like semiconductor layers 5008 to 5011 are formed by conducting patterning (the second etching treatment) of the enhanced crystallized first island-like semiconductor layers 5004 to 5006 into a desired shape (FIG. 19D).

After the second island-like semiconductor layers 5008 to 5011 are formed, a small amount of impurity element (boron or phosphorus) may be doped in order to control a threshold value of the TFT.

Next, a gate insulating film 5012 covering the second island-like semiconductor layers 5008 to 5011 is formed. The gate insulating film 5012 is formed by using an insulating film containing silicon with a thickness of 40 to 150 nm by using plasma CVD or sputtering. In this embodiment, a silicon oxynitride film (compositional ratio: Si=32%, O=59%, N=7% and H=2%) with a thickness of 110 nm is formed by the plasma CVD method. Of course, the gate insulating film is not limited to the silicon oxynitride film but an insulating film containing other silicon may be used as a single layer or as a laminated layer.

Further, when a silicon oxide film is used, it is formed by mixing TEOS (Tetraethyl Orthosilicate) and $O_2$ by plasma CVD method, (which is discharged) while discharging electric power under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. can give good characteristics to the silicon oxide film formed in this way as a gate insulating film.

Next, a first conductive film 5013, which is 20 to 100 nm in thickness, and a second conductive film 5014, which is 100 to 400 nm in thickness, are stacked on the gate insulating film 5012. In this embodiment, the first conductive film 5013 formed by a TaN film with a thickness of 30 nm and the second conductive film 5014 formed by a W film with a thickness of 370 nm are stacked. The TaN film is formed by sputtering and by using Ta target to perform sputtering in an atmosphere containing nitrogen. The W film is formed by a sputtering using W target. Alternatively, it can be formed by thermal CVD method using tungsten hexafluoride (WF$_6$). In both cases, the use of the gate electrode needs low resistance. Therefore, the resistivity of the W film is desirably 20 μΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive layer 5013 is TaN and the second conductive layer 5014 is W, they are not limited in particular. Both of them can be formed by an element selected from Ta, W, Ti, Mo, Al, Cu, Cr and Nd or an alloy material or a compound material mainly containing the above-described element. Alternatively, a semiconductor film, such as representatively a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film (FIG. 19E).

Next, mask 5015 containing resist using photolithography method are formed, and third etching processing is performed in order to form electrodes and wires. The third etching processing is performed under first and second etching conditions (FIG. 19F). The first etching condition in this embodiment is to use Inductively Coupled Plasma (ICP) etching method and to use CF$_4$, Cl$_2$ and O$_2$ as an etching gas, whose gas flow rate ratio is 25:25:10 sccm, respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the mask 5015 containing resist. Then, CF$_4$ and Cl$_2$ are used as etching gases. The gas flow rate ratio thereof is 30:30 sccm. 500 W of RF (13.56 MHz) power is supplied to a coil type electrode by 1 Pa pressure in order to generate plasma and then to perform etching for about 30 seconds. 20 W of RF (13.56 MHz) power is also supplied to a substrate side (test sample stage) and substantially negative self-bias voltage is applied. Under the second etching condition where CF$_4$ and Cl$_2$ are mixed, both W film and TaN film are etched to the same degree. In order to etch without leaving a residue on the gate insulating film, the etching time may be increased at a rate of about 10 to 20%.

In the third etching processing, when the shape of the mask containing resist is appropriate, the ends of the first and the second conductive layers are in the tapered form due to the effect of the bias voltage applied to the substrate side. The angle of the tapered portion is 15 to 45°. Thus, conductive layers 5016 to 5020 in a first form are formed which include the first conductive layers and the second conductive layers (first conductive layers 5016a to 5020a and second conductive layer 5016b to 5020b) through the third etching processing. In a gate insulating film 5012, an area not covered by the conductive layers 5016 to 5020 in the first form is etched about 20 to 50 nm so as to form a thinner area.

Next, fourth etching processing is performed without removing mask 5015 made from resist (FIG. 20A). Here, CF$_4$, Cl$_2$ and O$_2$ are used as an etching gas to etch the W film selectively. Then, second conductive layers 5021b to 5025b are formed by the fourth etching process. On the other hand, the first conductive layers 5016a to 5020a are hardly etched, and conductive layers 5021 to 5025 in the second form are formed.

First doping processing is performed without removing mask 5015 containing resist and low density of impurity element, which gives n-type to the second island-like semiconductor layer, is added. The doping processing may be performed by the ion-doping method or the ion-implanting method. The ion doping method is performed under a condition in the dose of $1 \times 10^{13}$ to $5 \times 10^{14}$ atoms/cm$^2$ and the accelerating voltage of 40 to 80 keV. In this embodiment, the ion doping method is performed under a condition in the dose of $1.5 \times 10^{13}$ atoms/cm$^2$ and the accelerating voltage of 60 keV. The n-type doping impurity element may be Group 15 elements, typically phosphorus (P) or arsenic (As). Here, phosphorus (P) is used. In this case, the conductive layers 5021 to 5025 function as masks for the n-type doping impurity element. Therefore, impurity areas 5026 to 5029 are formed in the self-alignment manner. An n-type doping impurity element in the density range of $1\times10^{18}$ to $1\times10^{20}$ atoms/cm$^3$ are added to the impurity areas 5026 to 5029.

When mask 5015 made from resist is removed, new mask 5030 made from resist is formed. Then, second doping processing is performed by using higher accelerating voltage than that used in the first doping processing. The ion doping method is performed under a condition in the dose of $1\times10^{13}$ to $1\times10^{15}$ atoms/cm$^2$ and the accelerating voltage of 60 to 120 keV. In the doping processing, the second conductive layers 5021b to 5025b are used as masks against the impurity element. Doping is performed such that the impurity element can be added to the second island-like semiconductor layer at the bottom of the tapered portion of the first conductive layer. Then, third doping processing is performed by having lower accelerating voltage than that in the second doping processing to obtain a condition shown in FIG. 20B. The ion doping method is performed under a condition in the dose of $1\times10^{15}$ to $1\times10^{17}$ atoms/cm$^2$ and the accelerating voltage of 50 to 100 keV. Through the second doping processing and the third doping processing, an n-type doping impurity element in the density range of $1\times10^{18}$ to $5\times10^{19}$ atoms/cm$^3$ is added to the low density impurity areas 5031 and 5032, which overlap with the first conductive layer. An n-type doping impurity element in the density range of $1\times10^{19}$ to $5\times10^{21}$ atoms/cm$^3$ is added to the high density impurity areas 5034 to 5036.

With proper accelerating voltage, the low density impurity area and the high density impurity area can be formed by performing the second doping processing and the third doping processing once.

Next, after removing mask 5030 made from resist, new mask 5037 containing resist is formed and then the fourth doping processing is performed. Through the fourth doping processing, impurity areas 5038 and 5039, to which an impurity element doping a conductive type opposite to the one conductive type is added, in a second island-like semiconductor layer, which is an active layer of a p-channel type TFT, are formed. Second conductive layers 5021a to 5025a are used as mask against the impurity element, and the impurity element giving p-type is added so as to form impurity areas in the self-alignment manner. In this embodiment, the impurity areas 5038 and 5039 are formed by applying ion-doping method using diborane (B$_2$H$_6$) (FIG. 20C). During the fourth doping processing, the second island-like semiconductor layer forming the n-channel TFT is covered by mask 5037 made from resist. Thorough the first to the third doping processing, phosphorus of different densities is added to each of the impurity areas 5038 and 5039. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the second island-like semiconductor layers, respectively, through the processes above.

Next, the mask 5037 made from resist is removed and a first interlayer insulating film 5040 is formed. The first interlayer insulating film 5040 may be an insulating film with a thickness of 100 to 200 nm containing silicon, which is formed by plasma CVD or sputtering. In this embodiment, silicon oxynitride film with a thickness of 150 nm is formed by plasma CVD. The first interlayer insulating film 5040 is not limited to the silicon oxynitride film but may be another insulating film containing silicon in a single layer or in a laminated.

Next, a process for activating impurities added to the second island-like semiconductor layer is conducted (FIG. 20D). A laser annealing method is used for the activation process. When a laser annealing method is used, the laser used in the crystallization can be used. When the activation processing is performed, the moving speed is the same as that of the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation process may be conducted before the first interlayer insulating film is formed.

After the heating processing (thermal processing at 300 to 550° C. for 1 to 12 hours) is performed, hydrogenation can be performed. This process terminates the dangling bond of the second island-like semiconductor layer with hydrogen contained in the first interlayer insulating film 5040. The second island-like semiconductor layer can be hydrogenated, irrespective of the existence of the first interlayer insulating film. Alternatively, the hydrogenation may be plasma hydrogenation (using hydrogen excited by plasma) or heating processing in an atmosphere containing 3 to 100% of hydrogen at 300 to 650° C. for 1 to 12 hours.

Next, a second interlayer insulating film 5041 formed by an inorganic insulating material or an organic insulator material is formed on the first interlayer insulating film 5040. In this embodiment, an acrylic resin film with a thickness of 1.6 μm is formed. Next, after the second interlayer insulating film 5041 is formed, the third interlayer insulating film 5042 is formed to contact with the second interlayer insulating film 5041.

Wirings 5043 to 5047 are formed. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate structure including three or more layers. The materials of the wirings are not limited to Al and Ti. For example, the wiring can be formed by forming Al or Cu on a TaN film and then by patterning the laminate film in which a Ti film is formed (FIG. 20E).

In this way, the drive circuit having a CMOS circuit including an n-channel TFT and a p-channel TFT, and the pixel portion having the pixel TFT and the storage capacitor can be formed on the same substrate. Thus, an active matrix substrate is completed.

The present embodiment can be implemented by freely combining Embodiment Modes 1 to 3 and Embodiments 1 to 6.

Embodiment 8

This embodiment explains, below, a process to manufacture a reflection type liquid crystal display device from the active matrix substrate made in Embodiment 7, using FIGS. 20 and 21.

First, after obtaining an active matrix substrate in the state of FIG. 20E according to Embodiment 5, an orientation film 5055 is formed at least on the wiring (the pixel electrodes) 5047 on the active matrix substrate and subjected to a rubbing process. Incidentally, in this embodiment, prior to forming an orientation film 5055, an organic resin film such as an acryl resin film is patterned to form columnar spacers

5054 in a desired position to support the substrates with spacing. Meanwhile, spherical spacers, in place of the columnar spacers, may be distributed over the entire surface of the substrate.

Then, a counter substrate 5048 is prepared. Then, coloring layers (color filters) 5049, 5050 (though only two color filters are shown here, actually three color filters; R, G, B may be used) and a planarizing film 5051 are formed on a counter substrate 5048. A light shielding portion is formed by overlapping a red color filter 5049 and a blue color filter 5050 together. Meanwhile, the light shielding portion may be formed by partly overlapping a red color filter and a green color filter. Similarly, a space between the adjacent pixels is shielded by the lamination of filters. Thus, description of a process of fabricating the light shielding film is omitted.

Then, a counter electrode 5052 of a transparent conductive film is formed on the planarizing film 5051 at least in the pixel portion. An orientation film 5053 is formed over the entire surface of the counter substrate and subjected to a rubbing process.

Then, the active matrix substrate and the counter substrate are bonded together by a seal member (not shown). The seal member (not shown) is mixed with filler so that the filler and the columnar spacers bond together the two substrates with an even spacing. Thereafter, a liquid crystal material 5056 is poured between the both substrates, and completely sealed by a sealant (not shown). The liquid crystal material 5056 may be a known liquid crystal material. In this manner, completed is a reflection type liquid crystal display device shown in FIG. 21. If necessary, the active matrix substrate or counter substrate is divided into a desired shape. Furthermore, a polarizing plate (not shown) is bonded only on the counter substrate. Then, an FPC (Flexible Print Circuit) substrate is bonded by a known technique.

The liquid crystal display device manufactured by the above process includes a TFT formed by using a semiconductor film in which crystal grains with large grain sizes are formed by irradiating a laser light with periodic or uniform energy density thereon and the operating characteristic and the reliability of the above-mentioned liquid crystal display device can be enough. Further, such a liquid crystal display device can be used as a display portion of all kinds of electronic devices.

The present embodiment can be implemented by freely combining with Embodiment Modes 1 to 3 and Embodiments 1 to 7.

Embodiment 9

In this embodiment, an example of a method for manufacturing a light emitting device will be described. The manufacturing method uses an active matrix substrate manufactured using the manufacturing method for the active matrix substrate described in Embodiment 7. The "light emitting device" is a generic name of a display panel formed such that light-emitting elements formed on a substrate are hermetically enclosed into between the substrate and a cover material, and a display module in which TFTs and the like are mounted on the display panel. The light-emitting element includes a layer (light-emitting layer) containing an organic compound with which electroluminescence (Electro Luminescence) generated by an electric field being applied is obtained, an anode layer, and a cathode layer. The electroluminescence in the organic compound has a luminescence (fluorescence) generated when the state returns from a single excited state to a normal state and a luminescence (phosphorescence) generated when the state returns from a triplet excited state to a normal state. The organic compound of this embodiment includes either one of these two types or the both types.

In the present specification, all layers formed between the anode and the cathode in the light-emitting element are defined as EL layers. Specifically, the EL layers include a light-emitting layer, a hole injection layer, an electron injection layer, a hole transporting layer, an electron transporting layer and the like. Basically, the light-emitting element has a structure in which an anode layer, a light-emitting layer, and a cathode layer are overlaid in that order. In addition to the structure, the light-emitting layer has a structure in which, an anode layer, a hole injection layer, a light-emitting layer, and a cathode layer are overlaid in that order or an anode layer, a hole injection layer, a light-emitting layer, an electron transporting layer, and a cathode layer are overlaid in that order.

After the formation of layers up to a third interlayer insulating film 5102 according to Embodiment 7, the pixel electrode working as the anode of the light-emitting element is formed of a material that is a transparent conductive film. To form the transparent conductive film, there can be used any one of a compound of indium oxide and tin oxide, a compound of indium oxide and zinc oxide, zinc oxide, tin oxide, and indium oxide. Alternatively, a transparent conductive film containing gallium may be used for the transparent film.

In the case of the light emitting device, the third interlayer insulating film 5102 is effective to prevent intrusion of moisture contained in the second interlayer insulating film 5101 into the organic light-emitting layer. When the second interlayer insulating film 5101 contains an organic resin material, since the organic resin material contains much moisture, the provision of the third interlayer insulating film 5102 is significantly effective. In addition, in this embodiment, it is very important to level stepped portions formed with TFTs by using the second interlayer insulating film 5101 formed from the resin. Since the light-emitting layer to be formed in a later step is very thin, defects in light emission can occur because of the existence of the steps. For this reason, the stepped portions are desirably leveled before the formation of the pixel electrode so that the light-emitting layer can be formed on a surface leveled as flat as possible.

The n-channel TFT and the p-channel TFT contained in the drive circuit are formed using the manufacturing method described in Embodiment 5. In this embodiment, while the TFTs have a single-gate structure, the TFTs may have a double-gate structure or a triple-gate structure.

Subsequently, as shown in FIG. 22B, a resin film formed of diffused materials, such as a black dye, carbon, and black pigment, is formed in such a manner as to cover the third interlayer insulating film 5102, an opening is formed in a portion to be a light emitting element and a shielding film (not shown) is thus formed. As the resin, representative examples include, for example, polyimide, polyamide, acrylic resin, benzocyclopolybutene (BCB) etc.; however, the material is not limited thereto. A material other than the organic resin may also be used as a material of the shielding film, of which examples are materials made by mixing a black dye, carbon, or black pigment with silicon, silicon oxide, silicon oxynitride, or the like. The shielding film is effective to prevent outside light reflected on wirings 5104 to 5110 from being visible to a viewer. After the above-described processing, contact holes reaching the individual impurity regions are formed, and the wirings 5104 to 5110 are then formed.

Subsequently, a bank 5111 is formed of a resin material. The bank 5111 is formed such that an acrylic film or polyimide film having a thickness of 1 to 2 µm is patterned to allow a pixel electrode 5103 to partly be exposed.

An EL layer 5112 is formed over the pixel electrode 5103. While FIG. 22B shows only one pixel, EL layers are separately formed corresponding to the individual colors R (red), G (green), and B (blue) in this embodiment. In addition, in this embodiment, a low-molecular based organic light-emitting material is formed by an evaporation method. Specifically, the material is formed to be a multi-layered structure such that a 20-nm thick copper phthalocyanine (CuPc) film is provided as a hole injection layer, and a 70-nm thick tris-8-hydroxyquinolinato aluminum complex (Alq$_3$) film is formed thereon as a light-emitting layer. The luminescent color can be controlled by adding a fluorescent pigment, such as quinacridone, perylene, or DCM1, to Alq$_3$.

However, the above examples are simply an example of organic light-emitting materials which can be used as the light-emitting film, and the present invention is not limited thereto in any way. The light-emitting layer (layer for causing light emission and a carrier thereof to move) may be formed by arbitrarily combining light-emitting layers and charge transporting films (or, charge injection layers). For example, while this embodiment has been described with reference to the example in which the low-molecular based organic light-emitting material is used as the light-emitting material, either intermediate-molecular based organic light-emitting material or a high-molecular based organic light-emitting material may be used. In this case, the intermediate-molecular based organic light-emitting material refers to an organic light-emitting material that does not have sublimation characteristics and that has 20 or fewer molecules or has a chained molecule length of 10 µm or smaller. As an example use of the high-molecular based organic light-emitting material, a multi-layered structure may be formed such that a 20-nm polythiophene (PEDOT) film is provided by spin coating as a hole injection film, and a polyphenylene vinylene (PPV) film of about 100 nm is provided thereon as a light-emitting film. Meanwhile, when π-conjugate based high molecules of PPV are used, light-emission wavelengths for a color range of from red to blue become selectable. Moreover, an inorganic material such as silicon carbide may be used as a material of the charge transporting film or the charge injection layer. For these organic light-emitting materials and inorganic materials, known materials may be used.

Next, a pixel electrode 5113 is provided as a cathode on the EL layer 5112. In this embodiment, an (aluminium) aluminum-lithium alloy film is used as the conductive film. (As a matter) of course, a known MgAg film (magnesium-silver alloy film) may be used. For the material of the cathode, either a conductive film formed of elements belonging to Group 1 or 2 in the periodic table or a conductive film to which these materials are added may be used.

The light-emitting element is completed upon formation of the layers up to the pixel electrode 5113. In this case, the light-emitting element refers to an element formed of the pixel electrode 5103 (anode), the EL layer 5112, and the cathode 5113.

In addition, a protection film 5114 may be formed in such a manner as to fully cover the light-emitting element. The protection film 5114 is formed of an insulating film including a carbon layer, a silicon nitride film, or a silicon oxynitride film, in which the insulating film is used in the form of either a single layer or a combined multilayer.

In this case, a film having a good coverage is preferably used for the protection film 5114; specifically, using a carbon film, particularly, a DLC (diamond-like carbon) film is effective. Since the DLC film can be formed in a temperature range of from a room temperature to 100° C. or lower, the film can easily be formed also on an upper portion of the light-emitting layer 5112 having a low heat resistance. In addition, since the DLC film has a high blocking effect against oxygen, oxidization of the light-emitting layer 5112 can be suppressed. Therefore, this enables to prevent a problem of oxidizing the light-emitting layer 5112 from occurring while a subsequent sealing step is being performed.

As described above, according to this embodiment, all the light-emitting layers 5112 are covered by the inorganic insulating film that has a high barrier property and that is formed of, for example, carbon, silicon nitride, silicon oxynitride, aluminum nitride, aluminum oxynitride or the like. Accordingly, the light-emitting layer can be prevented even more efficiently from being deteriorated due to entrance of moisture, oxygen, and the like.

In addition, when a silicon nitride film formed by a silicon-targeted sputtering is used for the third interlayer insulating film 5102 and the protection film 5114, entrance of impurity into the light-emitting layer can be prevented even more efficiently. While film formation conditions may appropriately be selected, sputtering is preferably performed using a nitrogen (N$_2$) or nitrogen-argon mixture gas and applying a high frequency power. In this case, the substrate temperature may be maintained at a room temperature, and no heating means needs to be used. When an organic insulating film or an organic compound layer has already been formed, the film formation is desirably performed with the substrate not being heated. However, in order to completely remove absorbed or occluded moisture, dehydration processing is preferably performed by heating the object for a period of several minutes to several hours at a temperature of 50 to 100° C. in a vacuum.

It is known that when a silicon nitride film is formed according to a sputtering performed in such a manner that silicon is targeted in a room temperature, a high frequency power of 13.56 MHz is applied, and only a nitrogen gas is used, the silicon nitride film is characterized as described hereunder. That is, in infrared adsorption spectra thereof, adsorption peaks of an N—H connection and an Si—H connection are not observed, nor is an adsorption peak of an Si—O. In addition, the oxygen concentration and the hydrogen concentration in the film are not higher than 1 atom %. Also from the above, it can be known that entrance of impurity such as oxygen and moisture can be prevented even more efficiently.

In this manner, the light-emitting device having the structure as shown in FIG. 22B is completed. Note that, it is effective that the steps up to the formation of the protection film 5114 after the formation of the bank 5111 are not exposed to the atmosphere but are continually processed.

In this embodiment, while the shielding film is formed between the third interlayer insulating film 5102 and the bank 5111, the present invention is not limited thereto. It is essential that the shielding film be provided in a position where outside light reflected in the wirings 5104 to 5110 is prevented from being visible to a viewer. For example, as in this embodiment, in the configuration where light emitted from the light-emitting element is directed to the substrate, the shielding film may be provided between the first interlayer insulating film and the second interlayer insulating film 5101. Also in this case, the shielding film includes an opening to enable the light from the light-emitting element to pass.

In addition, as described in Embodiment 7, the provision of the impurity region overlapping the gate electrode via the insulating film enables the formation of the n-channel TFT that has high resistance against deterioration occurring due to hot carrier effects. Accordingly, the light emitting device having high reliability can be implemented.

In this embodiment, only the configurations of the pixel portion and the drive circuit have been described. However, according to the manufacturing steps of this embodiment, other logic circuits such as a signal dividing circuit, a D/A converter, an operational amplifier, and γ correction circuit, can be formed on the same insulating material. Further, a memory, a microprocessor, and the like can also be formed.

The light emitting device manufactured as described above can be such that laser light of which energy distributions are periodic and uniform is irradiated, that includes TFTs manufactured using semiconductor layers in which large-size crystal grains are formed, and that exhibits sufficient performance characteristics and reliability. The light emitting device of the type described above can be used as display portions of various electronic devices.

According to this embodiment, light emitted from the light-emitting element is directed to the TFT. However, the light may be directed to the opposite side of the TFT. In this case, a resin mixed with a black dye, carbon, or black pigment may be used for the bank 5111. In this case, a material having high reflectance is used for the pixel electrode 5103, and a transparent conductive film is used for the pixel electrode 5113.

This embodiment may be implemented by freely combining with Embodiment Modes 1 to 3 and Embodiments 1 to 8.

Embodiment 10

In this embodiment, the cross-sectional structure of a TFT formed using the preparation method of the present invention will be described. Particularly in this embodiment, the cross-sectional structure of a bottom-gate-type TFT formed using the preparation method utilizing the principle of grapho-epitaxy will be described.

Figure 25:
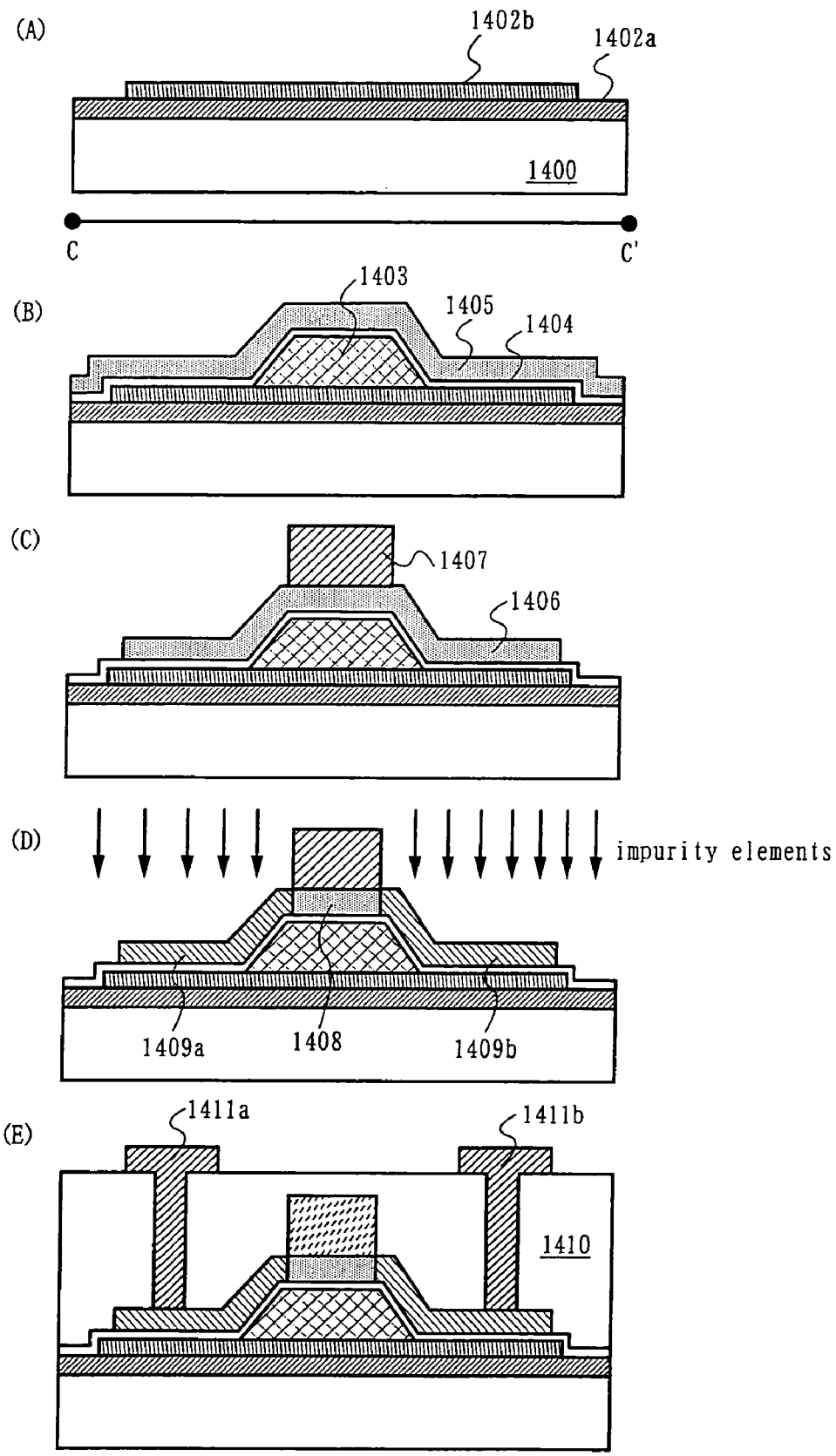
FIGS. 25A–25E are views for explaining a process for preparing a semiconductor device.

The description refers to FIG. 25. As shown in FIG. 25A, a first base film 1402a is formed on a substrate 1400. After that, a second base film is formed and patterned to form a protruding part 1402b.

As the first base film 1402a and the second base film, silicon oxide, silicon nitride-oxide, silicon oxynitride or the like can be used. However, in consideration of the step of patterning only the second base film formed on the first base film 1402a to form the protruding part 1402b, the first base film 1402a and the second base film need to contain different materials. Thus, the first base film 1402a and the protruding part 1402b form a recessed and protruding pattern.

Next, as shown in FIG. 25B, a conductive film is patterned to form a gate electrode 1403. It is desired that an end part of the gate electrode 1403 is tapered. Thus, a film formed on the top of the gate electrode 1403 can be prevented from being interrupted by steps. After that, a gate insulating film 1404 is formed. A semiconductor film 1405 is formed thereon. The semiconductor film 1405 is laser-annealed and thus crystallized. In laser annealing, a continuously oscillating laser beam is used. A beam spot formed by condensing this laser beam is moved on the semiconductor film. The semiconductor film is thus crystallized.

A designer can properly decide the shape and scanning direction of the beam spot in accordance with the shape of the recessed and protruding pattern.

Next, as shown in FIG. 25C, the crystallized semiconductor film 1405 is patterned to form an island-like semiconductor 1406. A channel stopper 1407 is formed thereon.

Next, as shown in FIG. 25D, doping with impurity elements is carried out through the channel stopper 1407. In this manner, a channel region 1408 overlapping the gate electrode 1403, and impurity regions 1409a and 1409b functioning as a source region and a drain region are formed.

Then, as shown in FIG. 25E, an interlayer insulating film 1410 is formed. Next, contact holes reaching the impurity regions 1409a and 1409b are formed. After that, a conductive film is deposited and patterned into a predetermined shape, thus forming a terminal 1411a and a terminal 1411b. One of the terminals 1411a and 1411b is equivalent to a source terminal. The other is equivalent to a drain terminal.

In the TFT thus formed, a polycrystalline semiconductor film formed on the protruding part of the recessed and protruding pattern is used as a channel region. Thus, the TFT having the channel region with good crystallinity can be manufactured.

This embodiment can be freely combined with Embodiment Modes 1 to 3 and Embodiments 1 to 9.

Embodiment 11

In this embodiment, the cross-sectional structure of a TFT formed using the preparation method of the present invention will be described. Particularly in this embodiment, the cross-sectional structure of a TFT having sidewalls and formed using the preparation method utilizing the principle of grapho-epitaxy will be described.

In FIG. 26A, an base film 1501 and an base film 1502 are formed on a substrate 1500 having an insulating surface. On the base film 1502, an active layer is provided which includes a channel forming region 1505, first impurity regions 1504 sandwiching the channel forming region 1505, and second impurity regions 1503 sandwiching the first impurity regions 1504 and the channel forming region 1505. A gate insulating film 1506 contacting the active layer, and a gate electrode 1508 formed on the gate insulating film 1506 are provided. Sidewalls 1507 are formed in contact with the lateral sides of the gate electrode 1508.

The sidewalls 1507 are superimposed on the first impurity regions 1504 with the gate insulating film 1506 provided between them. The sidewalls 1507 may be electrically conductive or insulating. If the sidewalls 1507 are electrically conductive, the sidewalls 1507 may be considered to be a part of the gate electrode.

In FIG. 26B, an base film 1511 and an base film 1512 are formed on a substrate 1510 having an insulating surface. On the base film 1512, an active layer is provided which includes a channel forming region 1515, first impurity regions 1514 sandwiching the channel forming region 1515, and second impurity regions 1513 sandwiching the first impurity regions 1514 and the channel forming region 1515. A gate insulating film 1516 contacting the active layer, and a gate electrode made up of two layers of conductive films 1519 and 1518 stacked on the gate insulating film 1516 are provided. Sidewalls 1517 are formed in contact with the top surface of the conductive film 1519 and the lateral sides of the conductive film 1518.

The sidewalls 1517 may be electrically conductive or insulating. If the sidewalls 1517 are electrically conductive, the sidewalls 1517 may be considered to be a part of the gate electrode.

In FIG. 26C, an base film 1521 and an base film 1522 are formed on a substrate 1520 having an insulating surface. On the base film 1522, an active layer is provided which includes a channel forming region 1525, first impurity regions 1524 sandwiching the channel forming region 1525, and second impurity regions 1523 sandwiching the first impurity regions 1524 and the channel forming region 1525. A gate insulating film 1526 contacting the active layer is formed, and then a conductive film 1528, a conductive film 1529 covering the top surface and the side surfaces of the conductive film 1528, and sidewalls 1527 contacting the lateral sides of the conductive film 1529 are formed on the gate insulating film 1526. The conductive film 1528 and the conductive film 1529 function as a gate electrode.

The sidewalls 1527 may be electrically conductive or insulating. If the sidewalls 1527 are electrically conductive, the sidewalls 1527 may be considered to be a part of the gate electrode.

This embodiment can be freely combined with Embodiment Modes 1 to 3 and Embodiments 1 to 9.

EFFECT OF THE INVENTION

The present invention provides a method for preparing a semiconductor in which plural second island-like semiconductors constituting a unit circuit are formed from first island-like semiconductors that are different from each other. For example, in the case of forming a unit circuit using three second island-like semiconductors, the three second island-like semiconductors are set to be at different distances from a pointed end part (a-point). Thus, the different properties of the second island-like semiconductors can be averaged. As a result, the properties of unit circuits can be equalized.

What is claimed is:

1. A method for manufacturing a semiconductor device comprising:
    forming an insulating film having plural projections over a substrate;
    forming a first film comprising amorphous semiconductor over the insulating film and at least between the projections;
    heating the first film for improving crystallinity of the first film comprising amorphous semiconductor, thereby producing a second film comprising crystalline semiconductor;
    etching the second film comprising crystalline semiconductor, thereby forming plural third films comprising crystalline semiconductor;
    irradiating the plural third film comprising crystalline semiconductor with a laser beam having a linear shape with changing a position of the substrate relative to the laser beam for improving crystallinity of the plural third films, thereby producing a plural fourth films comprising crystalline semiconductor;
    etching the plural fourth films comprising crystalline semiconductor for forming plural fifth films comprising crystalline semiconductor from the plural fourth films; and
    forming a circuit comprising plural transistors from at least a part of the plural fifth films comprising crystalline semiconductor,
    wherein at least the part of the fifth films are obtained from at least two of the fourth films.

2. A method of manufacturing a semiconductor device according to claim 1, further comprising forming a layer containing a metal element over the first film comprising amorphous semiconductor before heating the first film.

3. The method for manufacturing a semiconductor device according to claim 1, wherein the plural transistors are arranged so that all directions of migration of electric charges in their channel forming regions are substantially parallel to each other.

4. The method for manufacturing a semiconductor device according to claim 1, wherein directions of migration of electric charges in channel forming regions of the plural transistors are parallel to the direction of changing a position of the substrate relative to the laser beam.

5. The method for manufacturing a semiconductor device according to claim 1, wherein the plural transistors are connected in parallel.

6. The method for manufacturing a semiconductor device according to claim 1, wherein the laser beam is oscillated from a continuous wave laser apparatus.

7. The method for manufacturing a semiconductor device according to claim 1, wherein the laser beam is oscillated from a continuous wave laser selected from a YAG laser, a $YVO_4$ laser, a YLF laser, a $YAlO_3$ laser, a glass laser, a ruby laser, an alexandrite laser, and a Ti:sapphire laser.

8. The method for manufacturing a semiconductor device according to claim 1, wherein the laser beam is oscillated from a laser selected from a continuous wave excimer laser, an Ar laser, a Kr laser, and a $CO_2$ laser.

9. The method for manufacturing a semiconductor device according to claim 1, wherein the laser beam is oscillated from a laser selected from a continuous wave helium cadmium laser, a copper vapor laser, and a gold vapor laser.

* * * * *